US008514164B2

(12) United States Patent
Nishi et al.

(10) Patent No.: US 8,514,164 B2
(45) Date of Patent: Aug. 20, 2013

(54) DISPLAY DRIVER CIRCUIT

(75) Inventors: Kazuyoshi Nishi, Kyoto (JP); Junji Takiguchi, Osaka (JP); Tetsuo Asada, Osaka (JP); Osamu Sarai, Osaka (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 13/046,173

(22) Filed: Mar. 11, 2011

(65) Prior Publication Data

US 2011/0157146 A1 Jun. 30, 2011

Related U.S. Application Data

(62) Division of application No. 11/886,432, filed as application No. PCT/JP2006/305576 on Mar. 20, 2006, now Pat. No. 7,928,953.

(30) Foreign Application Priority Data

Mar. 29, 2005 (JP) ................................ 2005-094251
Nov. 22, 2005 (JP) ................................ 2005-336563

(51) Int. Cl.
*G09G 3/36* (2006.01)

(52) U.S. Cl.
USPC .............................. 345/100; 377/64; 345/204

(58) Field of Classification Search
USPC ................ 345/98, 100, 87, 204, 690, 76, 82; 377/64
See application file for complete search history.

(56) References Cited

U.S. PATENT DOCUMENTS

| | | | | |
|---|---|---|---|---|
| 6,184,855 | B1 | 2/2001 | Kobayashi et al. | |
| 6,392,485 | B1 | 5/2002 | Doi et al. | |
| 6,650,312 | B2 | 11/2003 | Tazuke | |
| 7,652,538 | B2 | 1/2010 | Choi | |
| 2006/0164368 | A1 * | 7/2006 | Tobita | 345/98 |

FOREIGN PATENT DOCUMENTS

| | | |
|---|---|---|
| JP | 10-133174 | 5/1998 |
| JP | 10-301537 | 11/1998 |
| JP | 11-259052 | 9/1999 |
| JP | 2000-039870 | 2/2000 |
| JP | 3063670 | 5/2000 |
| JP | 2000-165161 | 6/2000 |
| JP | 2000-221932 | 8/2000 |
| JP | 2000-295044 | 10/2000 |
| JP | 2001-156559 | 6/2001 |
| JP | 2002-014658 | 1/2002 |
| JP | 2003-228353 | 8/2003 |
| JP | 3586998 | 8/2004 |
| JP | 2006-094534 | 4/2006 |

* cited by examiner

*Primary Examiner* — Stephen Sherman
(74) *Attorney, Agent, or Firm* — McDermott Will & Emery LLP

(57) ABSTRACT

In an output mode, an output switch (SW11) is turned on and supply switches (SW13*a*, SW13*b*) are turned off, and output current is supplied to an intermediate node (nc) from driving transistors (T105*a*, T105*b*). In a transition mode, the output switch (SW11) is turned off and the supply switches (SW13*a*, SW13*b*) are turned on, and supply of the output current from the driving transistors (T105*a*, T105*b*) is shut off. Meanwhile, capacitance elements (C103*a*, C103*b*) receive voltage from reference nodes (Vcc, Vss). Also input voltage (Vin) is supplied to the intermediate node (nc).

5 Claims, 27 Drawing Sheets

DISPLAY DRIVER CIRCUIT

RELATED APPLICATIONS

This application is a Divisional of U.S. patent application Ser. No. 11/886,432, filed on Sep. 14, 2007, now U.S. Pat. No. 7,928,953, which is a U.S. National Phase under 35 U.S.C. §371 of International Application No. PCT/JP2006/305576, filed on Mar. 20, 2006, which in turn claims the benefit of Japanese Application Nos. 2005-094251, filed on Mar. 29, 2005, and 2005-336563, filed on Nov. 22, 2005, the entire contents of each of which are hereby incorporated by reference.

TECHNICAL FIELD

The present invention relates to driver circuits for driving display devices such as liquid crystal devices.

BACKGROUND ART

In order to drive vertical lines of display panels such as liquid crystal panels, display drivers are used. In the display drivers, display driver circuits are mounted in a number corresponding to the number of the vertical lines. Upon receipt of an input voltage with a gradation level (voltage value) corresponding to an image to be displayed, or upon receipt of a plurality of bit data inputs corresponding to the gradation level, the display driver circuit outputs to a vertical line corresponding thereto an output voltage corresponding to the input voltage.

As a conventional display driver circuit, Japanese Patent Application Publication No. 2001-156559 (patent document 1) is disclosed. Referring to FIG. 3 of patent document 1, the display driver circuit has a P-type MOS differential input part 1 composed of transistors M1, M2, and M3, an N-type MOS differential input part 2 composed of transistors M4, M5, and M6, a current mirror circuit 3 composed of transistors M7, M8, M9, and M10, a current mirror circuit 4 composed of transistors M11, M12, M13, and M14, a push-pull output stage 5 composed of transistors M15 and M16, and phase compensation capacitances C1 and C2. Vdd is a positive side power voltage and Vss is a negative side power voltage.

Operation of the display driver circuit disclosed in patent document 1 (FIG. 3) will be described with reference to FIG. 25. FIG. 25 shows a change in a voltage Vin supplied to the display driver circuit, a voltage Vc at a connection node of the phase compensation capacitances C1 and C2, and an output voltage Vout that the vertical line receives.

Upon shift to a transition mode, the output terminal of the display driver circuit is brought out of connection with the vertical line of the display. Also the voltage value of the input voltage Vin changes. The phase compensation capacitances C1 and C2 charge or discharge electric charge in accordance with the change in the voltage value of the input voltage Vin. As shown in FIG. 25, the voltage Vc at the connection node of the phase compensation capacitances C1 and C2 gradually rises. The rate of the charging/discharging is proportional to the current amounts of currents (tail currents) flowing through the transistors M1 and M6, and inversely proportional to the capacitance values of the phase compensation capacitances C1 and C2. Meanwhile, since the output terminal of the display driver circuit is disconnected from the vertical line, the voltage value of the output voltage Vout supplied to the vertical line remains unchanged.

Next, upon shift to an output mode, the output terminal of the display driver circuit is brought into connection with the vertical line so that the voltage Vc at the connection node of the phase compensation capacitances C1 and C2 is output to the vertical line through an output circuit 5. As shown in FIG. 25, the voltage value of the output voltage Vout gradually rises as the voltage Vc rises.

In addition to patent document 1, Japanese Patent Application Publication Nos. 11-259052 (patent document 2), 2000-295044 (patent document 3), 2003-228353 (patent document 4), and the like are also disclosed.

As a conventional display driver of a dot inversion driving system, Japanese Patent Application Publication No. 2002-14658 (patent document 5) is disclosed. In a display driver 10 of patent document 5 (FIG. 4), positive and negative gradation voltages are supplied to odd-numbered vertical lines and even-numbered vertical lines, respectively. Also a switch 16 is connected between adjacent display driver circuits 14. In this display driver, by turning on and off the switch 16, accumulated electric charge is distributed to each horizontal line, thus attempting to make an efficient use of electric charge.

Operation of (2$n$−1)th and (2$n$)th display driver circuits 14 (n being an integer) disclosed in patent document 5 (FIG. 4) will be described with reference to FIG. 26. FIG. 26 shows a change in input voltages Vin(2$n$−1) and Vin(2$n$) supplied to the respective display driver circuits, voltages Vc(2$n$−1) and Vc(2$n$) across the respective phase compensation capacitances of the display driver circuits, and output voltages Vout (2$n$−1) and Vout(2$n$) that the respective vertical lines receive.

First, the display driver circuits 14 respectively output output-voltages Vout(2$n$−1) and Vout(2$n$) corresponding to the input voltages Vin(2$n$−1) and Vin(2$n$), respectively. Here the phase compensation capacitances of the display driver circuits accumulate an amount of electric charge corresponding to the input voltages Vin(2$n$−1) and Vin(2$n$), respectively.

Next, upon shift to the transition mode, the switch 16 is turned on to connect the output terminal of the (2$n$−1)th display driver circuit 14 to the output terminal of the (2$n$)th display driver circuit 14. Each switch 15 is turned off to disconnect the output terminal from the vertical line. This causes the accumulated electric charge to be distributed to each vertical line, thus making the voltage values of the output voltages Vout(2$n$−1) and Vout(2$n$) median values. Meanwhile, the polarities of the input voltages Vin(2$n$−1) and Vin(2$n$) are inversed. As the input voltages Vin(2$n$−1) and Vin(2$n$) change, the voltages Vc(2$n$−1) and Vc(2$n$) across the respective phase compensation capacitances contained in the display driver circuits 14 gradually rise or fall toward respective target values, as shown in FIG. 26.

Next, upon shift to the output mode, the switch 16 is turned on and the switch 15 is turned off to connect the output terminal of each display driver circuit 14 to each vertical line, thus outputting the voltages Vc(2$n$−1) and Vc(2$n$) across the phase compensation capacitances through the respective output circuits. As the voltages Vc(2$n$−1) and Vc(2$n$) rise or fall, the voltage values of the output voltages Vout(2$n$−1) and Vout(2$n$) gradually rise or fall toward respective target values, as shown in FIG. 26.

In addition to patent document 5, Japanese Patent Publication Nos. 3586998 (patent document 6) and 3063670 (patent document 7), Japanese Patent Application Publication Nos. 2000-39870 (patent document 8), 2000-221932 (patent document 9), 10-133174 (patent document 10), 10-301537 (patent document 11), 2000-39870 (patent document 12), and 2000-221932 (patent document 13), U.S. Pat. No. 6,650,312 (patent document 14) and U.S. Pat. No. 6,184,855 (patent document 15), and the like are also disclosed.

Patent document 1: Japanese Patent Application Publication No. 2001-156559
Patent document 2: Japanese Patent Application Publication No. 11-259052
Patent document 3: Japanese Patent Application Publication No. 2000-295044
Patent document 4: Japanese Patent Application Publication No. 2003-228353
Patent document 5: Japanese Patent Application Publication No. 2002-14658
Patent document 6: Japanese Patent Publication No. 3586998
Patent document 7: Japanese Patent Publication No. 3063670
Patent document 8: Japanese Patent Application Publication No. 2000-39870
Patent document 9: Japanese Patent Application Publication No. 2000-221932
Patent document 10: Japanese Patent Application Publication No. 10-133174
Patent document 11: Japanese Patent Application Publication No. 10-301537
Patent document 12: Japanese Patent Application Publication No. 2000-39870
Patent document 13: Japanese Patent Application Publication No. 2000-221932
Patent document 14: U.S. Pat. No. 6,650,312
Patent document 15: U.S. Pat. No. 6,184,855

DISCLOSURE OF THE INVENTION

Problems to be Solved by the Invention

In order for the voltage value of the output voltage to change quickly to the target value, it was necessary to increase the tail current of the display driver circuit or decrease the capacitance value of the phase compensation capacitance. However, increasing the tail current involves an increase in circuit power consumption. A decrease in the capacitance value of the phase compensation capacitance undermines stability of the display driver circuit. Thus, a rapid change in the voltage value of the output voltage was difficult.

In addition, in the display driver circuits of the electric charge redistribution type disclosed in patent document 5 and the like, when a voltage difference occurs between the voltage value of the voltage of the output terminal and the voltage value of the voltage of the phase compensation capacitance, the voltage difference causes electric charge to be charged or discharged during shift from the transition mode to the output mode. This disables the electric charge to be efficiently reused, and the time spent for charging or discharging of the electric charge elongates the time required before the voltage value of the output voltage reaches the target value. Further, during the charging or discharging, a large amount of current flows in a short time, which increases EMI (Electro Magnetic Interference).

It is, therefore, an object of the present invention to make the voltage value of the output voltage rapidly change. Specifically, it is an object of the present invention to provide a display driver circuit that rapidly charges or discharges the phase compensation capacitance in the transition mode, and thus shortens the time required before the voltage value of the output voltage reaches the target value.

Means to Solve the Problems

According to one aspect of the present invention, a display driver circuit includes an input terminal to which an input voltage is supplied and an output terminal for outputting an output voltage to a vertical line of a display panel. Also, the display driver circuit includes an output mode in which the output voltage is supplied in response to the input voltage, and a transition mode in which a voltage value of the input voltage is changed. The display driver circuit has a differential amplification part, a first capacitance element, an output part, an output switch, a first supply switch, an input switch, and a supply switch part. The differential amplification part includes a first input node connected to the input terminal, a second input node, and a first output node. The differential amplification part outputs a first voltage from the first output node, the first voltage corresponding to a difference in voltages supplied to the first and second input nodes. The first capacitance element is connected between a first supply node and an intermediate node. The first supply node is connected to the first output node of the differential amplification part. The intermediate node is connected to the second input node of the differential amplification part. The output part includes an input-output node, a first driving transistor connected between a first reference node and the input-output node, and a second driving transistor connected between the input-output node and a second reference node. Also, the output part supplies an output current generated by the first and second driving transistors to the intermediate node through the input-output node. The output switch is connected between the input-output node of the output part and the output terminal, and turned on in the output mode and off in the transition mode. The first supply switch is connected between the first supply node and a third reference node, and turned off in the output mode and on in the transition mode. A voltage supplied to the third reference node has a lower impedance than an impedance of the first voltage from the differential amplification part. The input switch is connected between the intermediate node and the input terminal, and turned off in the output mode and on in the transition mode. The supply switch part causes the output part to execute supply of the output current in the output mode, and causes the output part to discontinue supply of the output current in the transition mode.

In the display driver circuit, in the output mode, the voltage at the intermediate node is supplied to the output terminal through the output part. In the transition mode, one end of the first capacitance element is connected to the third reference node, and the other end is connected to the input terminal. Since the voltage from the third reference node has a lower impedance, the charging or discharging rate of electric charge at the first capacitance element is higher than in the output mode. Therefore, in the transition mode, an amount of electric charge corresponding to the input voltage can be quickly accumulated on the first capacitance element, and thus the voltage value of the voltage of the first capacitance element can be quickly changed to the voltage value of the input voltage. Thus, the time before the voltage value of the output voltage reaches the target value (voltage value of the input voltage) after shift to the output mode becomes shorter than the time conventionally spent. Thus, the voltage value of the output voltage can be rapidly changed.

Also, the differential amplification part further has a second output node. The differential amplification part outputs a second voltage from the second output node, the second voltage corresponding to a difference in voltages supplied to the first and second input nodes. The display driver circuit further includes a second capacitance element and a second supply switch. The second capacitance element is connected between a second supply node and the intermediate node. The second supply node is connected to the second output node of the differential amplification part. The second supply switch is connected between the second supply node and a fourth reference node, and turned off in the output mode and on in the transition mode. A voltage supplied to the fourth reference node has a lower impedance than an impedance of the second voltage from the differential amplification part.

In the display driver circuit, in the output mode, the voltage at the intermediate node is supplied to the output terminal through the output part. In the transition mode, one end of the first capacitance element is connected to the third reference node, and the other end is connected to the input terminal. Also, one end of the second capacitance element is connected to the fourth reference node, and the other end is connected to the input terminal. Since the voltage from the third and fourth reference nodes has a lower impedance, the charging or discharging rate of electric charge at the first and second capacitance elements is higher than in the output mode. Therefore, in the transition mode, an amount of electric charge corresponding to the input voltage can be quickly accumulated on the first and second capacitance elements, and the voltage value of the voltage at the intermediate node can be quickly changed to the voltage value of the input voltage. Thus, the time before the voltage value of the output voltage reaches the target value after shift to the output mode becomes shorter than the time conventionally spent. Thus, the voltage value of the output voltage can be rapidly changed.

Preferably, the supply switch part includes a connection switch. The connection switch is provided between the intermediate node and the input-output node of the output part. The connection switch connects the intermediate node and the input-output node to each other in the output mode, and disconnects the intermediate node and the input-output node from each other in the transition mode.

In the display driver circuit, an output current flows through the first and second driving transistors of the output part. In the output mode, the output current of the output part is supplied between the intermediate node and the output terminal. In the transition mode, the intermediate node and the input-output node are disconnected from each other so that no output current is supplied between the intermediate node and the output terminal. This secures that no output current flows between the output part and the input terminal in the transition mode.

Preferably, the display driver circuit further includes a first current limiting transistor and a second current limiting transistor. The first current limiting transistor is connected between the first reference node and the first driving transistor, and receives a first predetermined voltage at a gate of the first current limiting transistor. The second current limiting transistor is connected between the second reference node and the second driving transistor, and receives a second predetermined voltage at a gate of the second current limiting transistor.

Preferably, the display driver circuit further includes a first clamping circuit and a second clamping circuit. The first clamping circuit limits a gate voltage of the first driving transistor. The second clamping circuit limits a gate voltage of the second driving transistor.

Preferably, the first supply switch, the second supply switch, and the input switch each change from an ON state to an OFF state before shift from the transition mode to the output mode.

In the display driver circuit, before shift to the output mode, a change in voltage at the first supply node, the second supply node, and the intermediate node can be inhibited.

According to another aspect of the present invention, a display driver circuit includes an input terminal to which an input voltage exhibiting positivity or negativity is supplied, and an output terminal for outputting a first output voltage to a vertical line of a display panel. Also, the display driver circuit includes an output mode and a transition mode. In the output mode, the output terminal is disconnected from another output terminal outputting a second output voltage to another vertical line of the display panel, the second output voltage having a polarity opposite to the polarity of the first output voltage, and the first output voltage is output in response to the input voltage. In the transition mode, the output terminal and the other output terminal are connected to each other, and the polarity of the input voltage is inversed. The display driver circuit has a differential amplification part, a first capacitance element, an output part, a first supply switch, and a supply switch part. The differential amplification part includes a first input node connected to the input terminal, a second input node, and a first output node. The differential amplification part outputs a first voltage from the first output node, the first voltage corresponding to a difference in voltages supplied to the first and second input nodes. The first capacitance element is connected between a first supply node and an intermediate node. The first supply node is connected to the first output node of the differential amplification part. The intermediate node is connected to the second input node of the differential amplification part. The output part includes an input-output node, a first driving transistor connected between a first reference node and the input-output node, and a second driving transistor connected between the input-output node and a second reference node. Also, the output part supplies an output current generated by the first and second driving transistors to the intermediate node and the output terminal through the input-output node. The first supply switch is connected between the first supply node and a third reference node, and turned off in the output mode and on in the transition mode. A voltage supplied to the third reference node has a lower impedance than an impedance of the first voltage from the differential amplification part. The supply switch part causes the output part to execute supply of the output current in the output mode, and causes the output part to discontinue supply of the output current in the transition mode.

In the display driver circuit, in the output mode, the voltage at the intermediate node is supplied to the output terminal through the output part. In the transition mode, the output terminal is connected to another output terminal, and accumulated electric charge is distributed to each output terminal. This makes the voltage value of the output voltage of the output terminal a median value. Also, one end of the first capacitance element is connected to the third reference node. Since the voltage from the third reference node has a lower impedance, the charging or discharging rate of electric charge at the first capacitance element is higher than in the output mode. Therefore, in the transition mode, an amount of electric charge corresponding to the voltage value (median value) of the voltage at the output terminal can be quickly accumulated on the first capacitance element, and the voltage value of the voltage of the first capacitance element can be quickly changed to a median value. Also, since the intermediate node and the output terminal are connected to each other, the voltage value of the voltage of the intermediate node and the voltage value of the voltage of the output terminal become equal to each other. Thus, the time before the voltage value of the output voltage reaches the target value (voltage value of the input voltage) after shift to the output mode becomes shorter than the time conventionally spent. Thus, the voltage value of the output voltage can be rapidly changed.

Also, since no charging or discharging of electric charge occurs at the output terminal during shift from the transition mode to the output mode, the distributed electric charge can be efficiently reused. This reduces power consumption.

Further, current does not flow in large amounts in a short time, thus reducing EMI.

Also, the differential amplification part further has a second output node. The differential amplification part outputs a second voltage from the second output node, the second voltage corresponding to a difference in voltages supplied to the first and second input nodes. The display driver circuit further includes a second capacitance element and a second supply switch. The second capacitance element is connected between a second supply node and the intermediate node. The second supply node is connected to the second output node of the differential amplification part. The second supply switch is connected between the second supply node and a fourth reference node, and turned off in the output mode and on in the transition mode. A voltage supplied to the fourth reference node has a lower impedance than an impedance of the second voltage from the differential amplification part.

In the display driver circuit, in the output mode, the voltage at the intermediate node is supplied to the output terminal through the output part. In the transition mode, the output terminal is connected to another output terminal, and accumulated electric charge is distributed to each output terminal. This makes the voltage value of the output voltage of the output terminal a median value. Also, one end of the first capacitance element is connected to the third reference node, and one end of the second capacitance element is connected to the fourth reference node. Since the voltage from the third and fourth reference nodes has a lower impedance, the charging or discharging rates of electric charge at the first and second capacitance elements is higher than in the output mode. Therefore, in the transition mode, an amount of electric charge corresponding to the voltage value (median value) of the voltage at the output terminal can be quickly accumulated on the first and second capacitance elements, and the voltage value of the voltage of the intermediate node can be quickly changed to a median value. Also, since the intermediate node and the output terminal are connected to each other, the voltage value of the voltage of the intermediate node and the voltage value of the voltage of the output terminal become equal to each other. Thus, the time before the voltage value of the output voltage reaches the target value (voltage value of the input voltage) after shift to the output mode becomes shorter than the time conventionally spent. Thus, the voltage value of the output voltage can be rapidly changed.

Preferably, the supply switch part includes an output switch, a first connection switch, and a second connection switch. The output switch is provided between the input-output node of the output part and the output terminal. The output switch connects the input-output node and the output terminal to each other in the output mode and disconnects the input-output node and the output terminal from each other in the transition mode. The first connection switch is provided between the intermediate node and the input-output node of the output part. The first connection switch connects the intermediate node and the input-output node to each other in the output mode and disconnects the intermediate node and the input-output node from each other in the transition mode. The second connection switch is provided between the intermediate node and the output terminal. The second connection switch disconnects the intermediate node and the output terminal from each other in the output mode and connects the intermediate node and the output terminal to each other in the transition mode.

In the display driver circuit, an output current flows through the first and second driving transistors of the output part. In the output mode, the output part is connected to the intermediate node and the output terminal. This causes an output current to be supplied between the intermediate node and the output terminal. In the transition mode, the output part is separated from the intermediate node and the output terminal. This secures that no output current flows between the intermediate node and the output terminal in the transition mode.

Preferably, the first and second supply switches each change from an ON state to an OFF state before shift from the transition mode to the output mode.

In the display driver circuit, before shift to the output mode, a change in voltage at the first supply node, the second supply node, and the intermediate node can be inhibited.

Preferably, the supply switch part includes a first connection switch and a second connection switch. The first connection switch is provided between a drain of the first driving transistor and the input-output node. The first connection switch connects the drain of the first driving transistor and the input-output node to each other in the output mode and disconnects the drain of the first driving transistor and the input-output node from each other in the transition mode. The second connection switch is provided between the input-output node and a drain of the second driving transistor. The second connection switch connects the input-output node and the drain of the second driving transistor to each other in the output mode and disconnects the input-output node and the drain of the second driving transistor from each other in the transition mode.

In the display driver circuit, in the output mode, an output current flows through the first and second driving transistors. In the transition mode, the drain of each of the first and second driving transistors is disconnected so that no output current flows. This enables it to discontinue flow of the output current flowing through the output part in the transition mode, resulting in a reduction in power consumption.

Preferably, a positive voltage is supplied to the first reference node while a negative voltage is supplied to the second reference node. The first driving transistor is a PMOS-type transistor having a source connected to the first reference node, a drain connected to the input-output node, and a gate receiving a voltage corresponding to a voltage of the first output node. The second driving transistor is an NMOS-type transistor having a source connected to the second reference node, a drain connected to the input-output node, and a gate receiving a voltage corresponding to a voltage of the second output node. The differential amplification part includes a first differential input circuit, a first current mirror circuit, a second differential input circuit, and a second current mirror circuit. The first differential input circuit includes a first input-side transistor and a second input-side transistor. A source of each of the first and second input-side transistors is connected to the second reference node. A gate of the first input-side transistor receives a voltage of the first input node. A gate of the second input-side transistor receives a voltage of the second input node. The first current mirror circuit includes a first output-side transistor and a second output-side transistor respectively receiving outputs of the first and second input-side transistors. A source of each of the first and second output-side transistors is connected to the first reference node. Gates of the first and second output-side transistors are connected to each other. A drain of the first output-side transistor is connected to the first output node. A gate and a drain of the second output-side transistor are connected to each other. The second differential input circuit includes a third input-side transistor and a fourth input-side transistor. A source of each of the third and fourth input-side transistors is connected to the first reference node. A gate of the third input-side transistor receives a voltage of the first input node. A gate of the fourth input-side transistor receives a voltage of the second input node. The second current mirror circuit includes a third output-side transistor and a fourth output-side transistor respectively receiving outputs of the third and fourth input-side transistors. A source of each of the third and fourth output-side transistors is connected to the second reference node. Gates of the third and fourth output-side transistors are connected to each other. A drain of the third output-side transistor is connected to the second output node. A gate and a drain of the fourth output-side transistor are connected to each other. The supply switch part includes a connection switch. The connection switch is provided between the first output node and the second output node. The connection switch connects the first output node and the second output node to each other in the output mode and disconnects the first output node and the second output node from each other in the transition mode.

In the display driver circuit, in the output mode, current flows through the first and second output nodes, and the first and second output nodes each output a voltage corresponding to a difference between the input voltage and a voltage of the intermediate node. In the transition mode, current no longer flows through the first and second output nodes, and the gate of the first driving transistor is supplied a positive voltage from the first reference node and the gate of the second driving transistor is supplied a negative voltage from the second reference node. Thus, the first and second driving transistors become inactivated so that no current flows through the output part. Thus, in the transition mode, the output current flowing through the output part can be discontinued, resulting in a reduction in power consumption.

Preferably, the differential amplification part further includes a first P-type transistor and a first N-type transistor connected in parallel between the first output node and the second output node, and a second P-type transistor and a second N-type transistor connected in parallel between the drains of the second and fourth output-side transistors. The connection switch includes a third P-type transistor connected between the first output node and the first P-type transistor and a third N-type transistor connected between the first N-type transistor and the second output node. The third P-type transistor and the third N-type transistor are turned on in the output mode and off in the transition mode.

In the display driver circuit, the inter-source-gate voltage of each of the first P-type transistor and the first N-type transistor can be rendered equal to a voltage in the case where the third P-type transistor and the third N-type transistor are not connected, thus inhibiting deviation of the operation point of the differential amplification part.

Preferably, the display driver circuit further includes a first shut-off switch and a second shut-off switch. The first shut-off switch is provided between the first output node and the first supply node. The first shut-off switch connects the first output node and the first supply node to each other in the output mode and disconnects the first output node and the first supply node from each other in the transition mode. The second shut-off switch is provided between the second output node and the second supply node. The second shut-off switch connects the second output node and the second supply node to each other in the output mode and disconnects the second output node and the second supply node from each other in the transition mode.

In the display driver circuit, in the transition mode, current does not flow between the first supply node and the first output node. Likewise current does not flow between the second supply node and the second output node. This enables it to change the voltage value of the output voltage rapidly, and to reduce power consumption.

Preferably, the third reference node is supplied a first stability voltage, which corresponds to a voltage at the first supply node in the output mode. The fourth reference node is supplied a second stability voltage, which corresponds to a voltage at the second supply node in the output mode.

In the display driver circuit, a change in voltage during shift from the transition mode to the output mode can be inhibited at the first and second supply nodes. This enables it to inhibit a change in the voltage of the intermediate node that occurs during shift to the output mode, and thus to change the voltage value of the output voltage further more rapidly.

Preferably, the display driver circuit further includes a power supply circuit. The power supply circuit generates the first and second stability voltages, and supplies the generated first stability voltage to the third reference node and supplies the generated second stability voltage to the fourth reference node.

Preferably, the power supply circuit includes a ladder resistor connected between the first reference node and the second reference node.

Preferably, the power supply circuit includes a supply differential amplification part, a third capacitance element and a fourth capacitance element, a third driving transistor and a fourth driving transistor, a first voltage follower circuit, and a second voltage follower circuit. The supply differential amplification part has a third input node receiving a predetermined voltage, a fourth input node, a third output node, and a fourth output node. The supply differential amplification part outputs a third voltage from the third output node and a fourth voltage from the fourth output node, the third and fourth voltages corresponding to a difference in voltages supplied to the third and fourth input nodes. The third and fourth capacitance elements are connected in series between a third supply node connected to the third output node and a fourth supply node connected to the fourth output node. A connection node connecting the third and fourth capacitance elements to each other is connected to the fourth input node. The third and fourth driving transistors are connected in series between the first reference node and the second reference node. A connection node connecting the third and fourth driving transistors to each other is connected to the connection node of the third and fourth capacitance elements. The first voltage follower circuit outputs the first stability voltage upon receipt of a voltage at the third supply node. The second voltage follower circuit outputs the second stability voltage upon receipt of a voltage at the fourth supply node.

Preferably, in the output mode, the supply switch part renders a connection state of the first driving transistor a state such that a source is connected to the first reference node and a drain is connected to the input-output node, and renders a connection state of the second driving transistor a state such that a source is connected to the second reference node and a drain is connected to the input-output node. In the transition mode, the supply switch part renders a connection state of the first driving transistor a state such that at least one of the source and the drain is disconnected, and renders a connection state of the second driving transistor a state such that at least one of the source and the drain is disconnected.

In the display driver circuit, in the output mode, an output current flows through the first and second driving transistors.

In the transition mode, no output current flows through the first and second driving transistors.

Preferably, a voltage supplied to the first reference node exhibits positivity, and a voltage supplied to the second reference node exhibits negativity. The first driving transistor is a P-type transistor having a source connected to the first reference node, a drain connected to the input-output node, and a gate. The second driving transistor is an N-type transistor having a source connected to the second reference node, a drain connected to the input-output node, and a gate. In the output mode, the supply switch part supplies a positive voltage to the gate of the first driving transistor and supplies a negative voltage to the gate of the second driving transistor. In the transition mode, the supply switch part supplies a negative voltage to the gate of the first driving transistor and supplies a positive voltage to the gate of the second driving transistor.

In the display driver circuit, in the output mode, the first and second driving transistors are activated so that an output current flows. In the transition mode, the first and second driving transistors are inactivated so that no output current flows.

Effects of the Invention

Thus, the voltage value of the output voltage can be rapidly changed. Also, distributed electric charge can be efficiently reused, resulting in a reduction in power consumption. Further, current does not flow in large amounts in a short time at the output terminal, thus reducing EMI.

Figure 1:
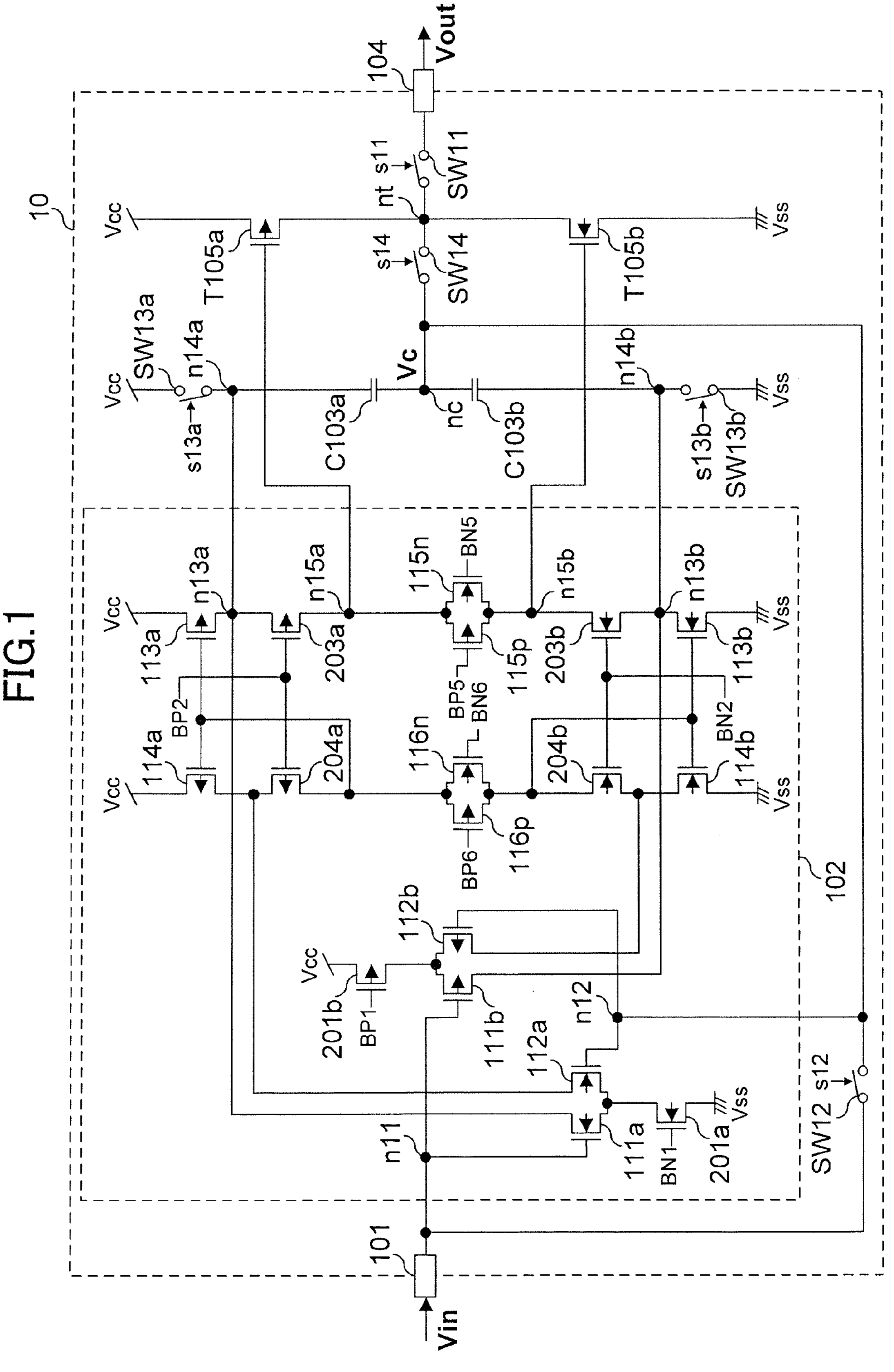
FIG. 1 is a circuit diagram showing a structure of a display driver circuit according to a first embodiment of this invention.

DESCRIPTION OF REFERENCE NUMERAL (10, 20, 30, 40, 50, 60, 70, 80, 90) Display driver circuit
(101) Input terminal
(102) Differential amplification part
(C103*a*, C103*b*) Phase compensation capacitance
(104) Output terminal
(T105*a*, T105*b*) Driving transistor
(SW11) Output switch
(SW12) Input switch
(SW13*a*, SW13*b*) Supply switch
(SW14, SW15*a*, SW15*b*, SW21, SW61) Connection switch
(SW22*n*, SW22*p*) Connection transistor
(SW31*a*, SW31*b*) Shut-off switch
(T401*a*, T401*b*) Current limiting transistor
(402*a*, 402*b*) Clamping circuit
(501) Power supply circuit
(SW60) Distribution switch

BEST MODE FOR CARRYING OUT THE INVENTION

Embodiments of this invention will be described in detail below with reference to the drawings. It should be noted that in the drawings, like numerals represent like or corresponding elements, and description thereof will not be repeated.

(First Embodiment)

<Structure>

FIG. 1 shows a structure of a display driver circuit according to a first embodiment of this invention. This circuit has an input terminal 101, a differential amplification part 102, phase compensation capacitances C103*a* and C103*b*, an output terminal 104, driving transistors T105*a* and T105*b*, an output switch SW11, an input switch SW12, supply switches SW13*a* and SW13*b*, and a connection switch SW14. This circuit drives a vertical line of a display panel; in an output mode, the circuit supplies the vertical line, through the output terminal 104, with an output voltage Vout corresponding to an input voltage Vin, which is supplied to the input terminal 101. In a transition mode, the voltage value of the input voltage Vin changes.

The input terminal 101 receives the input voltage Vin. The differential amplification part 102 has input nodes n11 and n12, and output nodes n13*a* and n13*b*. The input node n11 is connected to the input terminal 101. The differential amplification part 102 generates two voltages corresponding to a difference in voltages supplied to the input nodes n11 and n12, and outputs one of the voltages from the output node n13*a* and the other voltage from the output node n13*b*.

The phase compensation capacitance C103*a* has one end connected to a supply node n14*a*, which is led to the output node n13*a*, and the other end connected to the phase compensation capacitance C103*b*. The phase compensation capacitance C103*b* has one end connected to a supply node n14*b*, which is connected to the output node n13*b*, and the other end connected to the phase compensation capacitance C103*a*. A connection node (intermediate node) nc of the phase compensation capacitances C103*a* and C103*b* is connected to the input node n12 of the differential amplification part 102.

The output terminal 104 is connected to the vertical line (not shown) of a display panel. The driving transistors T105*a* and T105*b* are connected in series between a power node Vcc and a ground node Vss and constitute an output circuit for generating idling current (output current). The output switch SW11 is connected between a connection node (input-output node of the output circuit) nt of the driving transistors T105*a*, T105*b* and the output terminal 104.

The input switch SW12 is connected between the intermediate node nc and the input terminal 101. The supply switch 13*a* is connected between the power node Vcc and the supply node n14*a*. The supply switch SW13*b* is connected between the supply node n14*b* and the ground node Vss. The connection switch SW14 is connected between the intermediate node nc and the node nt of the output circuit.

The switches SW11, SW12, SW13*a*, SW13*b*, and SW14 are respectively controlled by control signals s11, s12, s13*a*, s13*b*, and s14 from, for example, a control circuit (not shown) to be turned on/off.

<Internal Structure of the Differential Amplification Part>

The differential amplification part 102 includes a high voltage differential input circuit having a pair of input-side transistors 111*a* and 112*a*, a high voltage current mirror circuit having a pair of output-side transistors 113*a* and 114*a*, a low voltage differential input circuit having a pair of input-side transistors 111*b* and 112*b*, a low voltage current mirror circuit having a pair of output-side transistors 113*b* and 114*b*, and a pair of connection circuits connected between the high voltage current mirror circuit and the low voltage current mirror circuit.

The input-side transistors 111*a* and 112*a* each have a source connected to the ground node Vss through an adjustment transistor 201*a*. A gate of the input-side transistor 111*a* receives the voltage (the input voltage Vin supplied to the input terminal 101) of the input node n11, and a gate of the input-side transistor 112*a* receives the voltage (the voltage Vc at the intermediate node nc) of the input node n12.

The output-side transistors 113*a* and 114*a* have gates connected to each other and each have a source connected to the power node Vcc. Drains of the output-side transistors 113*a* and 114*a* each form a cascode connection with a pair of cascode transistors 203*a* and 204*a*, respectively.

The output node n13*a*, which is led to the supply node n14*a*, is located between the drain of the output-side transistor 113*a* and a source of the cascode transistor 203*a*.

The input-side transistors 111*b* and 112*b* each have a source connected to the power node Vcc through an adjustment transistor 201*b*. A gate of the input-side transistor 111*b* receives the voltage (the input voltage Vin supplied to the input terminal 101) of the input node n11, and a gate of the input-side transistor 112*b* receives the voltage (the voltage Vc at the intermediate node nc) of the input node n12.

The output-side transistors 113*b* and 114*b* have gates connected to each other and each have a source connected to the ground node Vss. Drains of the output-side transistors 113*b* and 114*b* each form a cascode connection with a pair of cascode transistors 203*b* and 204*b*, respectively.

The output node n13*b*, which is led to the supply node n14*b*, is located between the drain of the output-side transistor 113*b* and a source of the cascode transistor 203*b*.

Between the cascode transistors 203*a* and 203*b*, connection transistors 115*n* and 115*p* are connected in parallel. A node n15*a*, which is led to a gate of the driving transistor T105*a*, is located between a drain of the cascode transistor 203*a* and a drain (source of 115*p*) of the connection transistor 115*n*. A node n15*b*, which is led to a gate of the driving transistor T105*b*, is located between a drain of the cascode transistor 203*b* and a drain (source of 115*n*) of the connection transistor 115*p*. Between the cascode transistors 204*a* and 204*b*, connection transistors 116*n* and 116*p* are connected in parallel. It should be noted that for these connection circuits, load resistance may be used instead of transistors connected in parallel.

<Operation>

Figure 2:
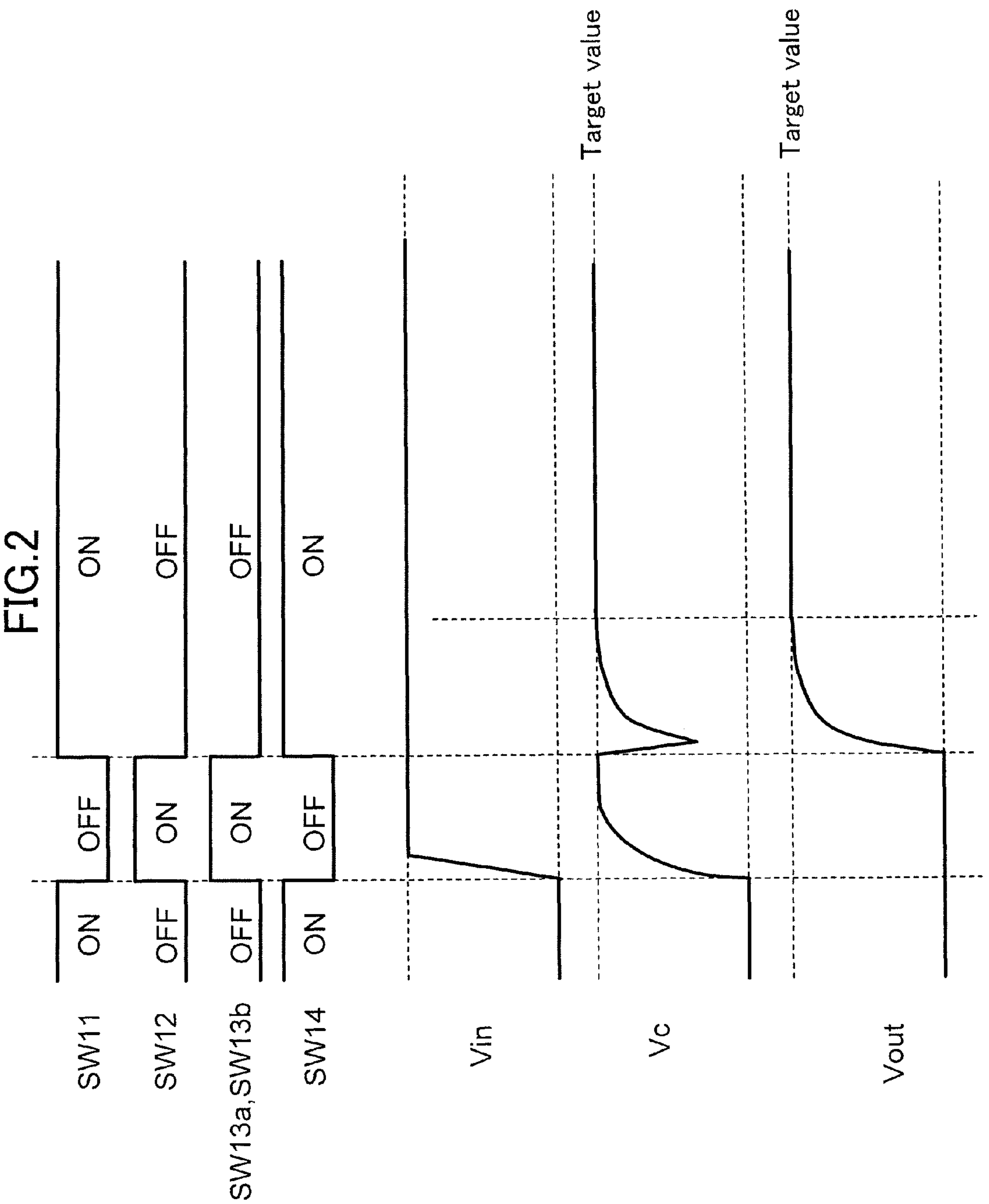
FIG. 2 is a timing chart for describing operation of the display driver circuit shown in FIG. 1.

Operation of the display driver circuit 10 shown in FIG. 1 will be described with reference to FIG. 2. FIG. 2 shows a change in the input voltage Vin, which is input to the input terminal 101, the capacitance voltage Vc, which is at the intermediate node nc, and the output voltage Vout, which is supplied from the output terminal 104.

[Output Mode]

First, the display driver circuit 10 is assumed to be in an "output mode". In this case, the output switch SW11 and the connection switch SW14 are turned on, and the input switch SW12 and the supply switches SW13*a* and SW13*b* are turned off. At the intermediate node nc, the voltage (capacitance voltage) Vc occurs with a voltage value corresponding to the input voltage Vin, and the output terminal 104 outputs the output voltage Vout with a voltage value corresponding to the capacitance voltage Vc (i.e., a voltage value corresponding to the input voltage Vin).

[Transition Mode]

Next, the display driver circuit 10 shifts to a "transition mode". In this case, the output switch SW11 and the connection switch SW14 are turned off, and the input switch SW12 and the supply switches SW13*a* and SW13*b* are turned on. Also, the voltage value of the input voltage Vin changes to a new voltage value.

Meanwhile, the supply node n14*a* is brought into connection with the power node Vcc so that one end of the phase compensation capacitance C103*a* receives voltage from the power node Vcc. Also, the supply node n14*b* is brought into connection with the ground node Vss so that one end of the phase compensation capacitance C103*b* receives voltage from the ground node Vss. Further, the intermediate node nc is brought into connection with the input terminal 101 so that the phase compensation capacitances C103*a* and C103*b* receive the input voltage Vin.

The phase compensation capacitances C103*a* and C103*b* charge or discharge electric charge corresponding to the voltage value of the input voltage Vin. In response to the charging or discharging of electric charge, the voltage value of the capacitance voltage Vc at the intermediate node nc changes. Since the voltage from the power node Vcc and the ground node Vss has a lower impedance than an impedance of the voltage from the output nodes n13a and n13b, the charging or discharging rate of electric charge at the phase compensation capacitances C103a and C103b is higher than in the output mode. Therefore, the phase compensation capacitances C103a and C103b are able to accumulate quickly an amount of electric charge corresponding to the input voltage Vin. This enables it to change quickly the voltage value of the capacitance voltage Vc to the voltage value of the input voltage Vin, and thus to complete the charging or discharging of electric charge at the phase compensation capacitances C103a and C103b during the transition mode.

[Output Mode]

Next, the display driver circuit 10 shifts from the "transition mode" to the "output mode". In this case, the output switch SW11 and the connection switch SW14 are turned on, and the input switch SW12 and the supply switches SW13a and SW13b are turned off.

The intermediate node nc is brought into connection with the output terminal 104 through the connection switch SW14, the node nt of the output circuit, and the output switch SW11. Thus, the voltage Vc of the intermediate node is supplied to the output terminal 104 through the output circuit. Here the voltage value of the capacitance voltage Vc reaches the voltage value of the input voltage Vin, and, therefore, the time before the voltage value of the output voltage Vout reaches a target value (voltage value of the input voltage Vin) after shift to the output mode is shorter than the time conventionally spent. The change rate of the voltage value of the output voltage Vout depends on a time constant of an output impedance of this display driver circuit 10 and a load capacitance of the display (not shown).

Thus, in the transition mode, by rapidly changing the voltage value of the capacitance voltage Vc to the voltage value of the input voltage Vin, the time before the voltage value of the output voltage Vout reaches the target value can be shortened.

<Effects>

Thus, the voltage value of the output voltage can be rapidly changed without increasing tail current or decreasing the capacitance value of the phase compensation capacitance.

Also, since the input switch SW12 is off in the transition mode, no through-current (current path: Vcc→T105a→nt→SW14→SW12→101) flows between the driving transistor T105a and the input terminal 101, and likewise no through-current (current path: 101→SW12→SW14→nt→T105b→Vss) flows between the driving transistor T105b and the input terminal 101.

(Modified Example of the First Embodiment)

Figure 3:
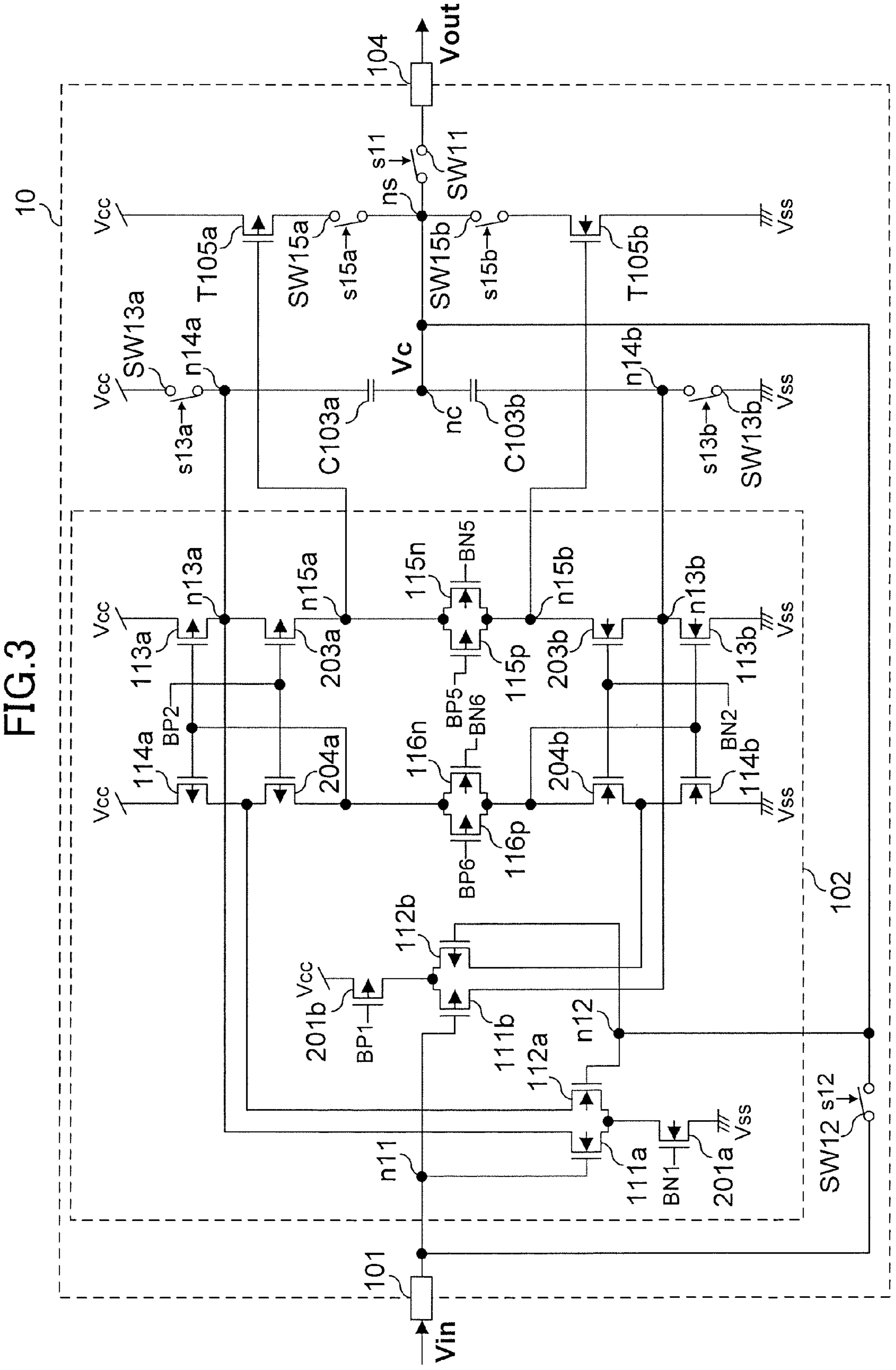
FIG. 3 is a circuit diagram showing a modified example of the display driver circuit shown in FIG. 1.

Similar advantageous effects are provided when, as shown in FIG. 3, the display driver circuit 10 has connection switches SW15a and SW15b instead of the connection switch SW14 as shown in FIG. 1. The connection switches SW15a and SW15b are connected in series between the driving transistors T105a and T105b. A connection node ns of the connection switches SW15a and SW15b is connected to the intermediate node nc and the output terminal 104. The switches SW15a and SW15b are respectively controlled by control signals s15a and s15b from, for example, a control circuit (not shown) to be turned on/off. The timing for turning on/off each of the connection switches SW15a and SW15b is similar to the case of the connection switch SW14, and also operation of the display driver circuit 10 is similar to the case shown in FIG. 2. This structure enables it to discontinue idling current (current path: Vcc→T105a→SW15a→ns→SW15b→T105b→Vss) flowing through the output circuit in the transition mode. This reduces power consumption.

Similar advantageous effects are provided when in the display driver circuit 10 shown in FIG. 3, the connection switch SW15a is connected between the power node Vss and the driving transistor T105a, and the connection switch SW15b is connected between the driving transistor T105b and the ground node Vss. Further, similar advantageous effects are provided when in the display driver circuit 10 shown in FIG. 3, the connection switch SW15a is connected between the node n15a and the gate of the driving transistor T105a, and the connection switch SW15b is connected between the node n15b and the gate of the driving transistor T105b. That is, in the transition mode, at least one of the source, drain, and gate of each of the driving transistors T105a and T105b is turned into a disconnected state.

(Second Embodiment)

<Structure>

Figure 4:
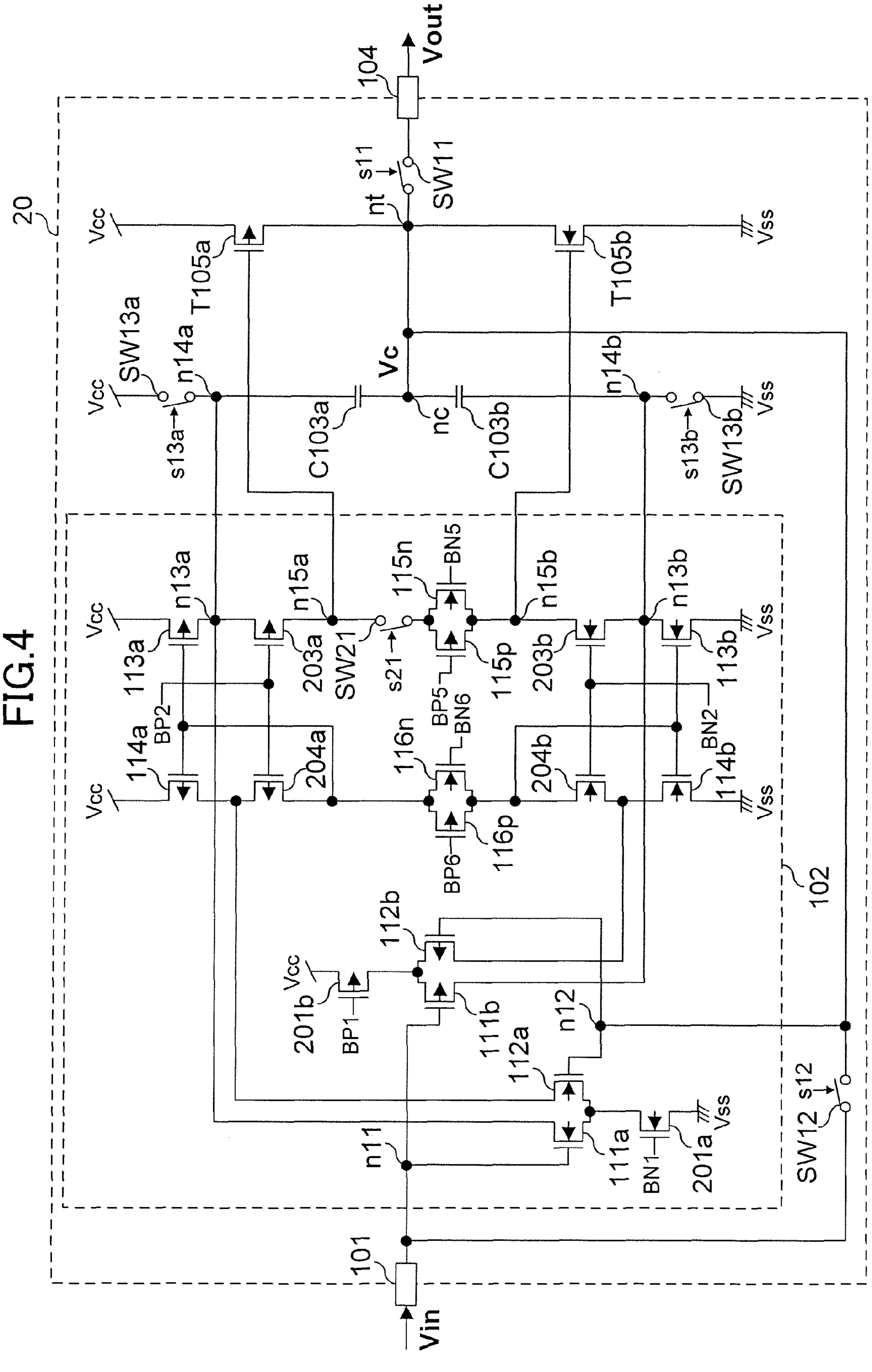
FIG. 4 is a circuit diagram showing a structure of a display driver circuit according to a second embodiment of this invention.

FIG. 4 shows a structure of a display driver circuit 20 according to a second embodiment of this invention. This circuit has a connection switch SW21 in place of the connection switch SW14 shown in FIG. 1. The connection switch SW21 is connected between the drain of the cascode transistor 203a and the drain of the connection transistor 115n (source of the connection transistor 115p). The connection switch SW21 is controlled by a control signal s21 from, for example, a control circuit (not shown) to be turned on/off. The timing for turning on/off the connection switch SW21 is similar to the case of the connection switch SW14. The intermediate node nc is connected to the output terminal 104 through the node nt of the output circuit. The rest of the structure is similar to the case shown in FIG. 1.

<Operation>

Operation of the display driver circuit 20 shown in FIG. 4 is similar to the case of the display driver circuit 10 shown in FIG. 1; here description will be made of operation associated with the connection switch SW21.

[Output Mode]

In the output mode, the connection switch SW21 is turned on. The drain of the cascode transistor 203a is brought into connection with the drain of the connection transistor 115n (source of the connection transistor 115p). That is, the node n15a is brought into connection with the node n15b through the switch SW21 and the connection transistors 115n and 115p. This causes current to flow between the node n15a and the node n15b, and the output nodes n13a and n13b and the nodes n15a and n15b each output a voltage corresponding to a difference between the input voltage Vin and the capacitance voltage Vc. Meanwhile, the driving transistors T105a and T105b become activated so that an idling current flows through the output circuit (i.e., between the driving transistors T105a and T105b).

[Transition Mode]

In the transition mode, the connection switch SW21 is turned off. Here a voltage from the power node Vcc is supplied to the gate of the driving transistor T105a through the supply switch SW13a, the supply node n14a, the output node n13a, the cascode transistor 203a, and the node n15a, thus making the driving transistor T105a inactivated. Meanwhile, a voltage from the ground node Vss is supplied to the gate of the driving transistor T105b through the supply switch SW13b, the supply node n14b, the output node n13b, the cascode transistor 203b, and the node n15b, thus making the driving transistor T105b inactivated. Thus, no idling current flows through the output circuit.

Also, since the connection switch SW21 is off, no idling current (current path: Vcc→n13*a*→n15*a*→115n→n15*b*→n13*b*→Vss) flows between the node n15*a* and the node n15*b*.

Thus, since idling current flows through the output circuit in the output mode while no idling current flows in the transition mode, power consumption by the idling current can be reduced.

<Effects>

Thus, the voltage value of the output voltage can be rapidly changed, and power consumption can be reduced. Also, the number of switches is small as compared with the display driver circuit 10 shown in FIG. 3, resulting in a reduction in circuit size.

Similar advantageous effects are provided when, referring to FIG. 4, the connection switch SW21 is connected between the source of the connection transistor 115*n* (drain of the connection transistor 115*p*) and the drain of the cascode transistor 203*b*.

(Modified Example of the Second Embodiment)

Figure 5:
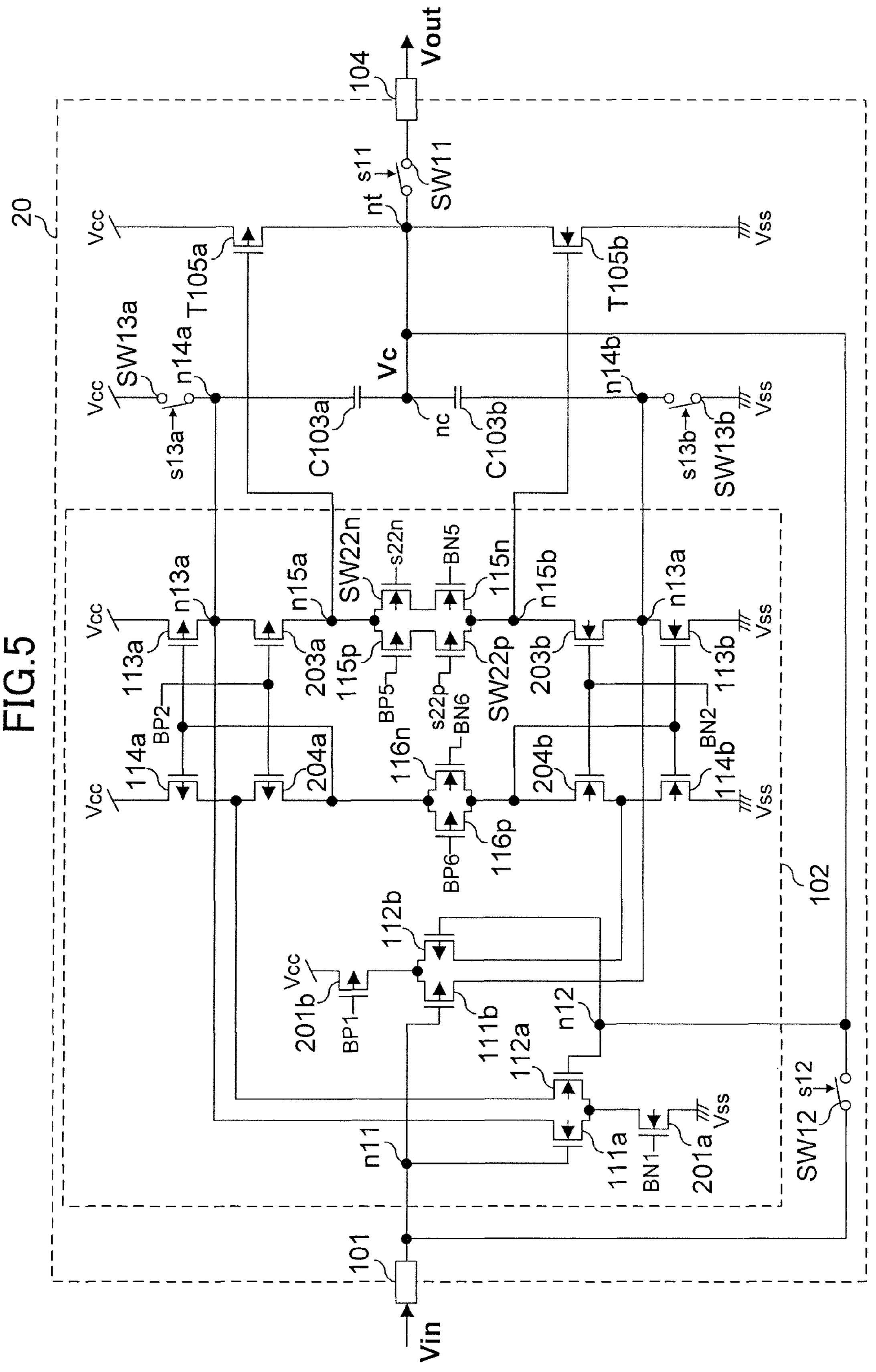
FIG. 5 is a circuit diagram showing a modified example of the display driver circuit shown in FIG. 4.

Also, similar advantageous effects are provided when, as shown in FIG. 5, the display driver circuit 20 has connection transistors SW22*n* and SW22*p* instead of the connection switch SW21. The connection transistor SW22*n* is connected between the drain of the cascode transistor 203*a* and the drain of the connection transistor 115*n*. The connection transistor SW22*p* is connected between the drain of the cascode transistor 203*b* and the source of the connection transistor 115*p*. The switches SW22*n* and SW22*p* are respectively controlled by control signals s22*n* and s22*p* from, for example, a control circuit (not shown) to be turned on/off. The timing for turning on/off each of the connection transistors SW22*n* and SW22*p* is similar to the case of the switch SW21. This structure enables it to equalize the source-gate voltage of each of the connection transistors 115*n* and 115*p* to the case where the connection transistors SW22*n* and SW22*p* are not connected (e.g., the case of FIG. 1). This in turn enables it to inhibit dislocation of the operation point of the differential amplification part 102.

(Third Embodiment)

<Structure>

Figure 6:
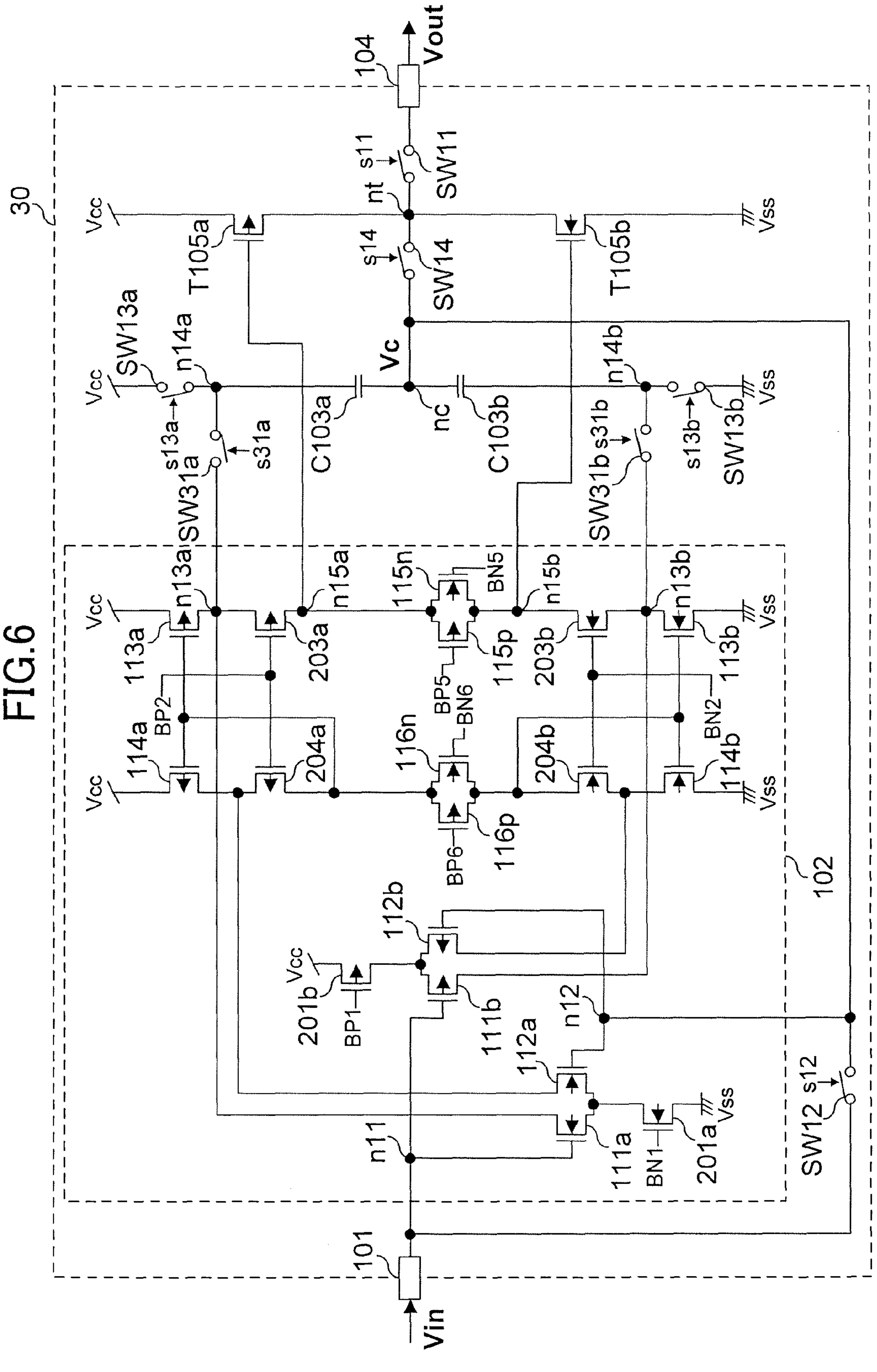
FIG. 6 is a circuit diagram showing a structure of a display driver circuit according to a third embodiment of this invention.

FIG. 6 shows a structure of a display driver circuit 30 according to a third embodiment of this invention. This circuit 30 has shut-off switches SW31*a* and SW31*b*, in addition to the structure of the display driver circuit 10 shown in FIG. 1. The shut-off switch SW31*a* is connected between the output node n13*a* and the supply node n14*a*. The shut-off switch SW31*b* is connected between the output node n13*b* and the supply node n14*b*. The shut-off switches SW31*a* and SW31*b* are respectively controlled by control signals s31*a* and s31*b* from, for example, a control circuit (not shown) to be turned on/off. The timing for turning on/off each of the shut-off switches SW31*a* and SW31*b* is similar to the case of the output switch SW11.

<Operation>

Operation of the display driver circuit 30 shown in FIG. 6 is similar to the case of the display driver circuit 10 shown in FIG. 1; here description will be made of operation associated with the shut-off switches SW31*a* and SW31*b*.

[Output Mode]

Upon shift to the output mode, the shut-off switches SW31*a* and SW31*b* are turned on, and the supply switches SW13*a* and SW13*b* are turned off. The supply node n14*a* is connected to the output node n13*a* instead of being connected to the power node Vcc. The supply node n14*b* is connected to the output node n13*b* instead of being connected to the ground node Vss. This causes the phase compensation capacitance C103*a* to receive voltage from the output node n13*a*, and causes the phase compensation capacitance C103*b* to receive voltage from the output node n13*b*.

[Transition Mode]

Upon shift to the transition mode, the shut-off switches SW31*a* and SW31*b* are turned off, and the supply switches SW13*a* and SW13*b* are turned on. The supply node n14*a* is connected to the power node Vcc instead of being connected to the output node n13*a*. The supply node n14*b* is connected to the ground node Vss instead of being connected to the output node n13*b*. Thus, no through-current (current path: Vcc→n14*a*→n13*a*→111*a*→201*a*→Vdd) flows between the supply node n14*a* and the output node n13*a*. Likewise, no through-current (current path: Vcc→201*b*→111*b*→n13*b*→n14*b*→Vss) flows between the supply node n14*b* and the output node n13*b*. Further, no through-current (current path: Vcc→SW13*a*→*n*14*a*→*n*13a→203*a*→415*n*→203*b*→*n*13*b*→*n*14*b*→SW13*b*→Vss) flows between the node n15*a* and the node n15*b*.

Thus, in the transition mode, the through-current can be shut off.

<Effects>

Thus, the voltage value of the output voltage can be rapidly changed, and power consumption can be reduced.

It should be noted that the shut-off switches SW31*a* and SW31*b* are applicable to the display driver circuit shown in FIG. 3.

(Fourth Embodiment)

<Structure>

Figure 7:
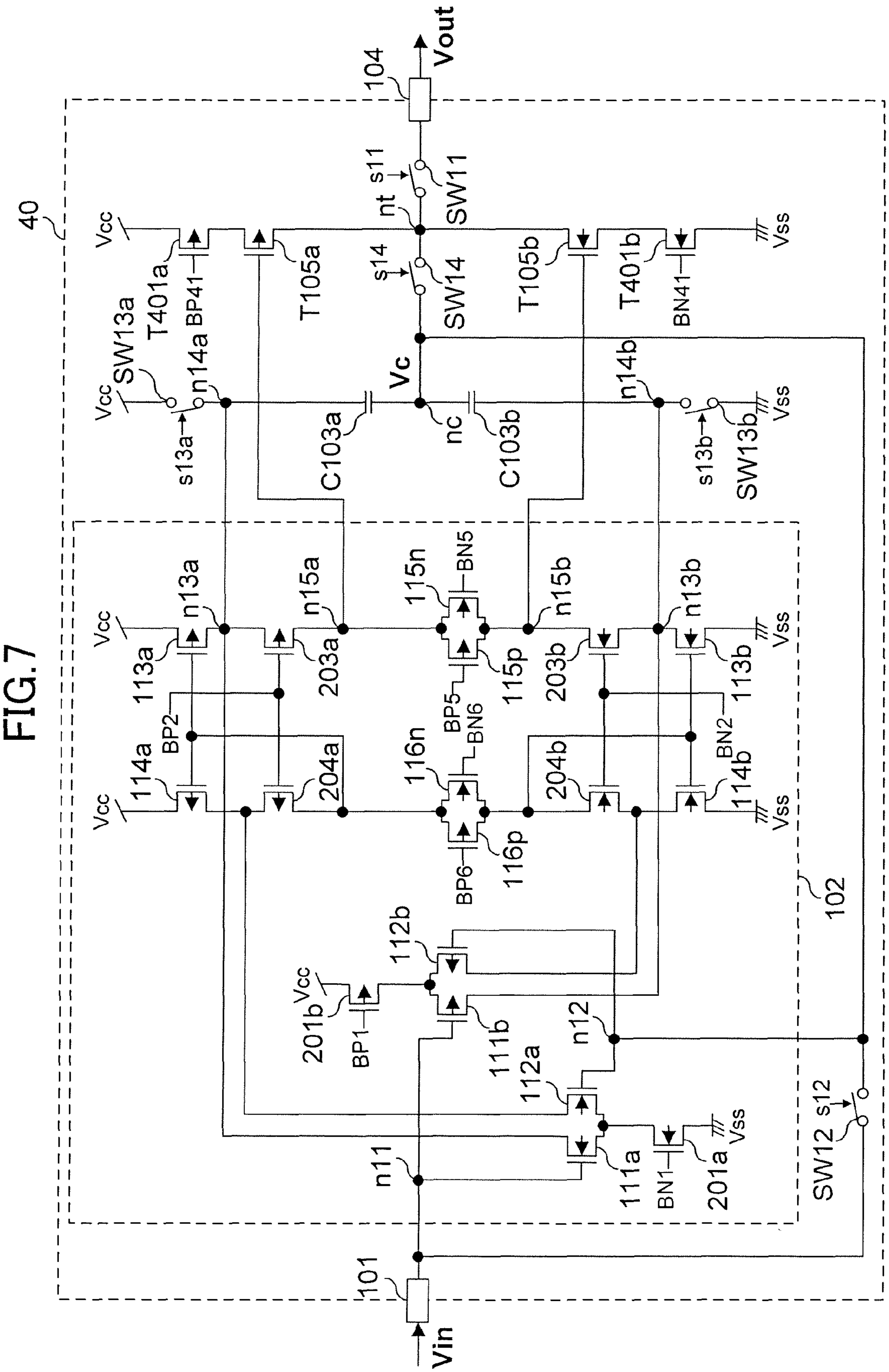
FIG. 7 is a circuit diagram showing a structure of a display driver circuit according to a fourth embodiment of this invention.

FIG. 7 shows a structure of a display driver circuit 40 according to a fourth embodiment of this invention. This circuit 40 has current limiting transistors T401*a* and T401*b* in addition to the structure of the display driver circuit 10 shown in FIG. 1. The current limiting transistor T401*a* is connected between the power node Vcc and the source of the driving transistor T105*a*. The current limiting transistor T401*b* is connected between the source of the driving transistor T105*b* and the ground node Vss. By adjusting the voltage values of voltages BP41 and BN41 respectively supplied to the current limiting transistors T401*a* and T401*b*, the current amount of the output current flowing through the output circuit can be adjusted.

<Effects>

Thus, the voltage value of the output voltage can be rapidly changed, and the current amount of the output current can be adjusted. For example, when the maximum value of the output current is represented by "IMAX" and the load capacitance of the display panel is represented by "CL", then the through rate is represented by "IMAX/CL". Thus, the rising speed or falling speed of the display driver circuit can be controlled, and the drivability thereof can be adjusted in accordance with the properties of the display panel.

(Modified Example of the Fourth Embodiment)

Figure 8:
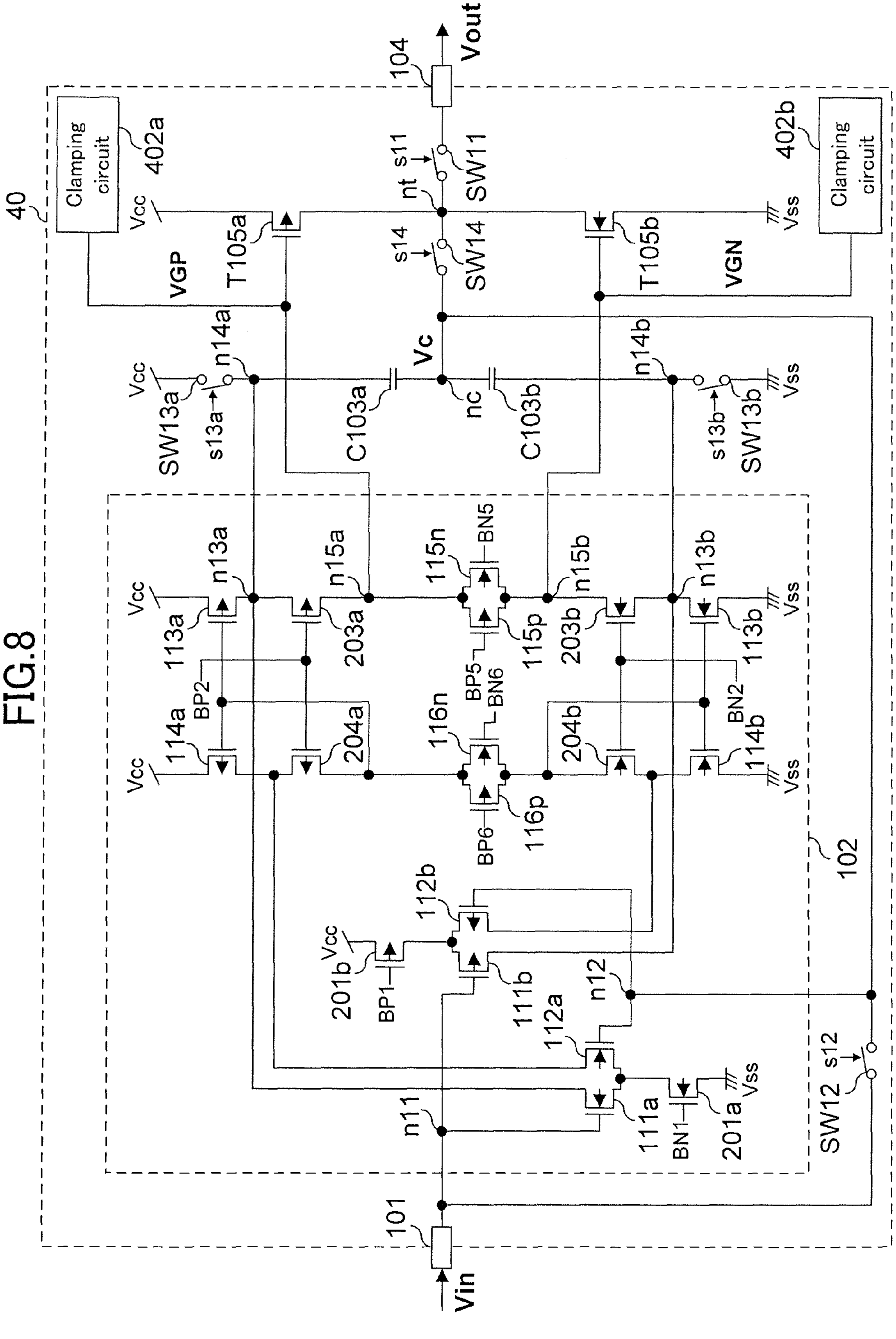
FIG. 8 is a circuit diagram showing a modified example of the display driver circuit shown in FIG. 7.

Similar advantageous effects are provided when, as shown in FIG. 8, the display driver circuit 40 has clamping circuits 402*a* and 402*b* instead of the current limiting transistors T401*a* and T401*b*. The clamping circuit 402*a* limits the voltage value of a voltage VGP supplied to the gate of the driving transistor T105*a*. The clamping circuit 402*b* limits the voltage value of a voltage VGN supplied to the gate of the driving transistor T105*b*. This structure enables it to adjust the rising speed or falling speed of the display driver circuit while keeping the output impedance thereof lower than the case shown in FIG. 7.

Figure 9:
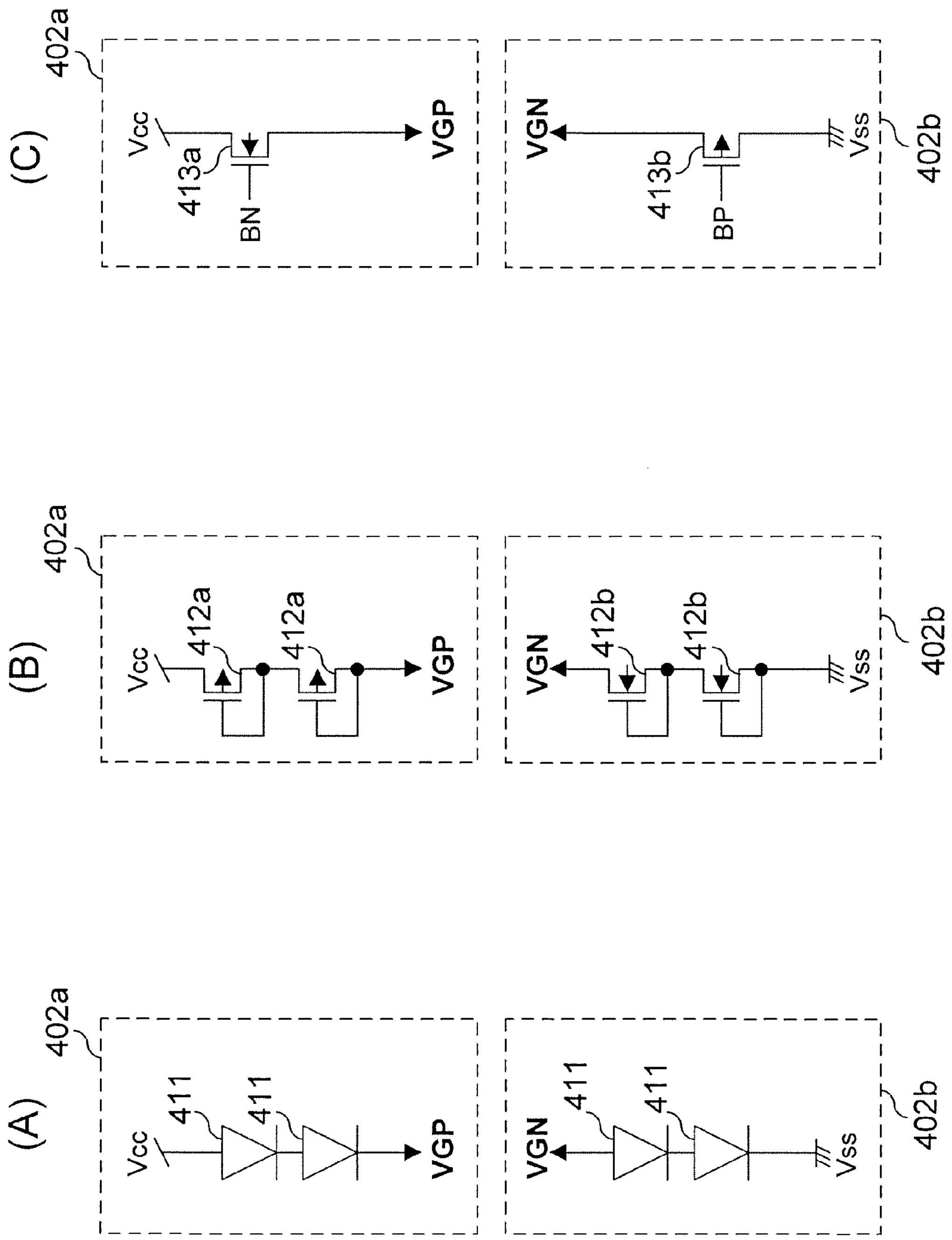
FIGS. 9A, 9B, and 9C are circuit diagrams showing structural examples of a clamping circuit shown in FIG. 8.

The clamping circuits 402*a* and 402*b* shown in FIG. 8 each may be composed of a plurality of diodes 411 connected in series as shown in FIG. 9A. Alternatively, the clamping circuits 402*a* and 402*b* each may be composed of a plurality of diode connection-type transistors 412*a* and 412*b* connected in series as shown in FIG. 9B. Still alternatively, the clamping circuits 402*a* and 402*b* may be respectively composed of transistors 413*a* and 413*b* receiving predetermined voltages BN and BP applied to respective gates as shown in FIG. 9C.

It should be noted that the current limiting transistors T401*a* and T401*b* shown in FIG. 7 and the clamping circuits 402*a* and 402*b* shown in FIG. 8 are applicable to the display driver circuits shown in FIGS. 3, 4, 5, and 6.

(Fifth Embodiment)

<Structure>

Figure 10:
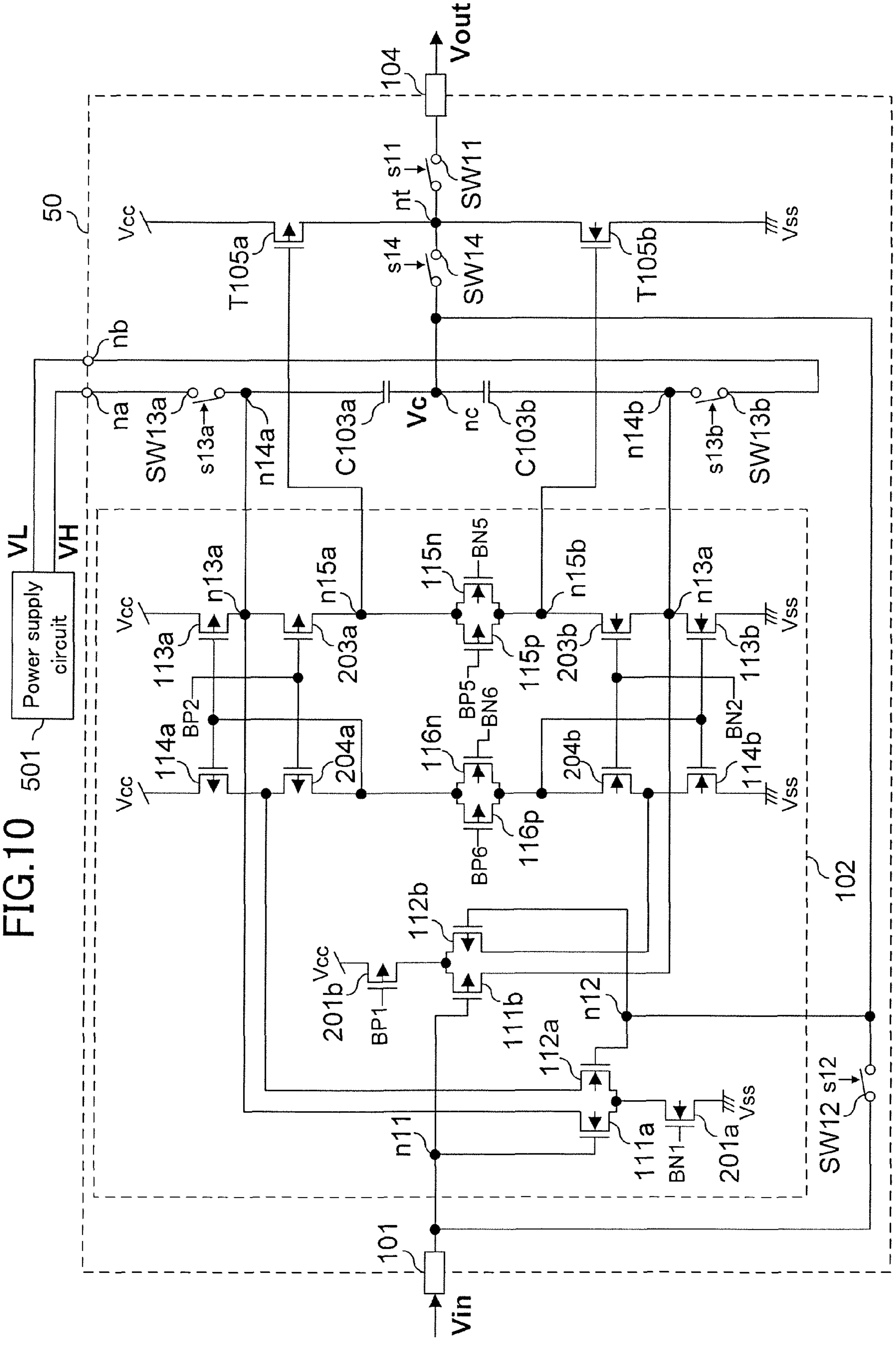
FIG. 10 is a circuit diagram showing a structure of a display driver circuit according to a fifth embodiment of this invention.

FIG. 10 shows a structure of a display driver circuit 50 according to a fifth embodiment of this invention. This circuit 50 has a node na for receiving a stability voltage VH and a node nb for receiving a stability voltage VL, instead of the power node Vcc, which is led to the supply switch SW13*a*, and the ground node Vss, which is led to the supply switch SW13*b*, as shown in FIG. 1. The rest of the structure is similar to the case shown in FIG. 1.

The voltage value of the stability voltage VH is equal to the voltage value of the voltage of the supply node n14*a* in the output mode (i.e., when the supply switch SW13*a* is off). The voltage value of the stability voltage VL is equal to the voltage value of the voltage of the supply node n14*b* in the output mode (i.e., when the supply switch SW13*b* is off). The stability voltages VH and VL are generated by a power supply circuit 501.

<Internal Structure of the Power Supply Circuit>

Figure 11A:
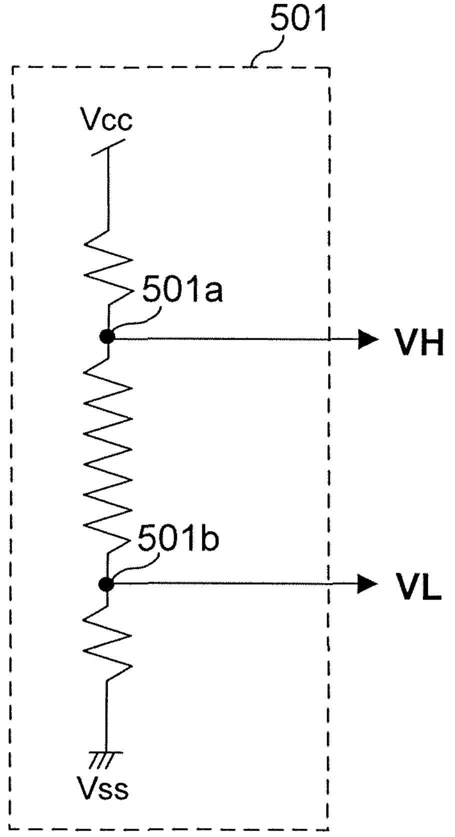
FIG. 11A is a circuit diagram showing a structural example of a power supply circuit shown in FIG. 10.

As shown in FIG. 11A, the power supply circuit 501 may be a ladder resistor connected between the power node Vcc and the ground node Vss. Output of a tap 501*a* of the ladder resistor is supplied as the stability voltage VH. Output of a tap 501*b* of the ladder resistor is supplied as the stability voltage VL. This structure enables it to generate the stability voltages VH and VL by resistor voltage division.

Figure 11B:
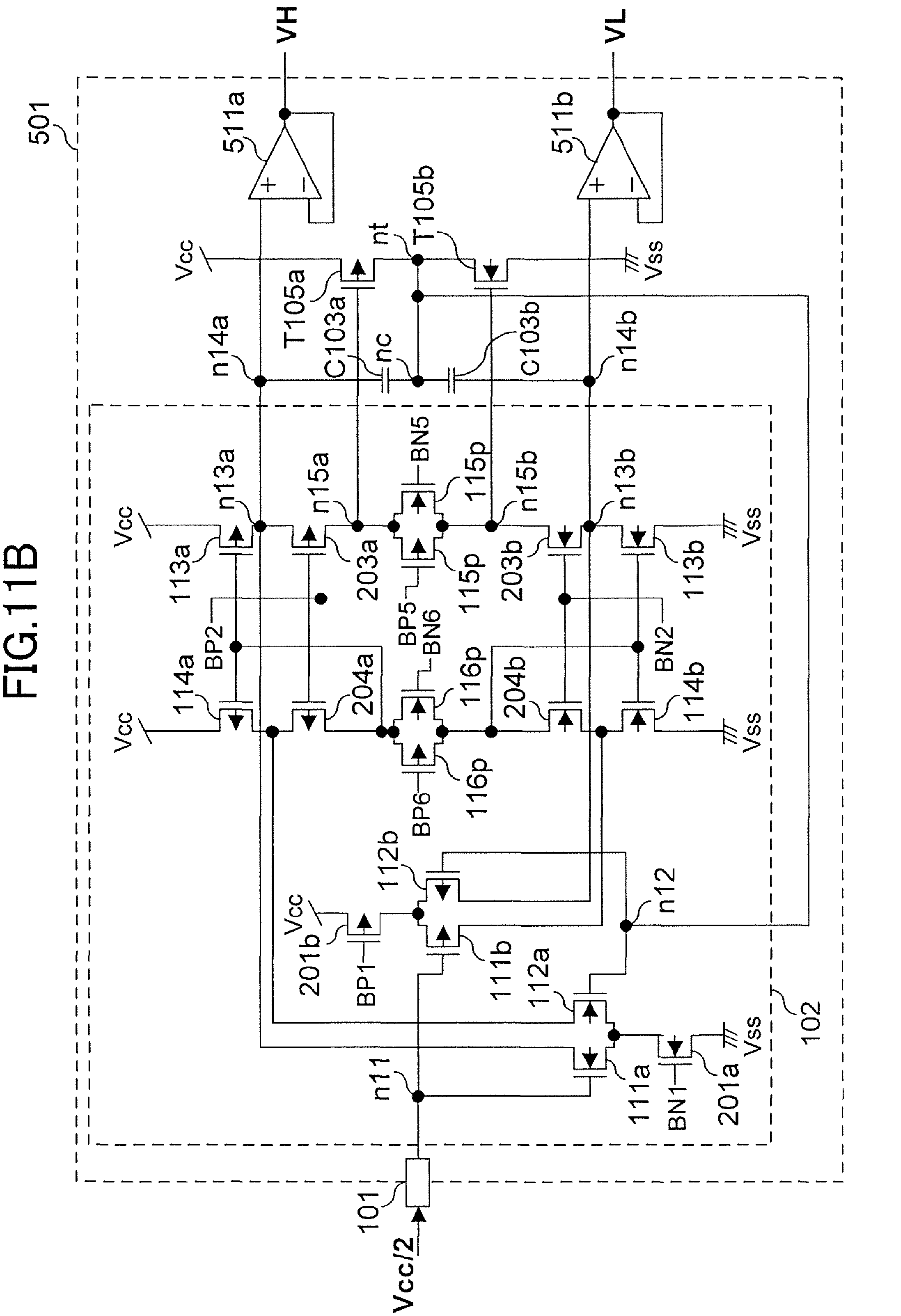
FIG. 11B is a circuit diagram showing a structural example of the power supply circuit shown in FIG. 10.

Also, as shown in FIG. 11B, the power supply circuit 501 may be configured to have the input terminal 101, differential amplification part 102, phase compensation capacitances C103*a* and C103*b*, driving transistors T105*a* and T105*b*, and voltage follower circuits 511*a* and 511*b*. The intermediate node nc is connected to the node nt of the output circuit. The supply node n14*a* is connected to the voltage follower circuit 511*a*. The supply node n14*b* is connected to the voltage follower circuit 511*b*. The input terminal 101 is supplied a voltage with, for example, the voltage value "VCC/2" (VCC being the voltage value of voltage at the power node Vcc). Output of the voltage follower circuit 511*a* is supplied as the stability voltage VH. Output of the voltage follower circuit 511*b* is supplied as the stability voltage VL. The power supply circuit 501 with this structure has increased strength against a change in temperature and a change in power voltage.

<Operation>

Operation of the display driver circuit 50 shown in FIG. 10 is similar to the case of the display driver circuit 10 shown in FIG. 1; here description will be made of operation associated with the power supply circuit 501.

Here a change in voltage at the supply nodes n14*a* and n14*b* will be described. The voltage value of voltage at the supply node n14*a* in the output mode is slightly lower than the voltage value of the voltage of the power node Vcc. The voltage value of voltage at the supply node n14*b* in the output mode is slightly higher than the voltage value of the voltage of the ground node Vss. Thus, when in the transition mode the voltage from the power node Vcc is supplied to the supply node n14*a*, the discrepancy in voltage value causes the supply node n14*a* to be charged or discharged upon shift from the transition mode to the output mode. A similar phenomenon occurs to the supply node n14*b*.

In the present embodiment, in the transition mode, the supply switch SW13*a* is turned on, and one end of the phase compensation capacitance C103*a* is brought into connection with the node na to which the stability voltage VH is supplied. This inhibits a change in voltage at the supply node n14*a* in the output mode. Also, the supply switch SW13*b* is turned on, and one end of the phase compensation capacitance C103*b* is brought into connection with the node nb to which the stability voltage VL is supplied. This inhibits a change in voltage at the supply node n14*b* in the output mode.

Thus, a change in voltage that occurs upon shift from the transition mode to the output node at the one end of the phase compensation capacitance C103*a* and the one end of the phase compensation capacitance C103*b* is inhibited, which inhibits charging or discharging of electric charge at the phase compensation capacitance C103*a* and the phase compensation capacitance C103*b* caused by a change in voltage at the nodes n14*a* and n14*b*.

<Effects>

Thus, a change in the voltage Vc that occurs upon shift from the transition mode to the output mode at the intermediate node is inhibited, thus enabling it to change the voltage value of the output voltage further more rapidly.

It should be noted that the power supply circuit 501 is applicable to the display driver circuits shown in FIGS. 3, 4, 5, 6, 7, and 8.

(On/Off Timing)

Figure 12:
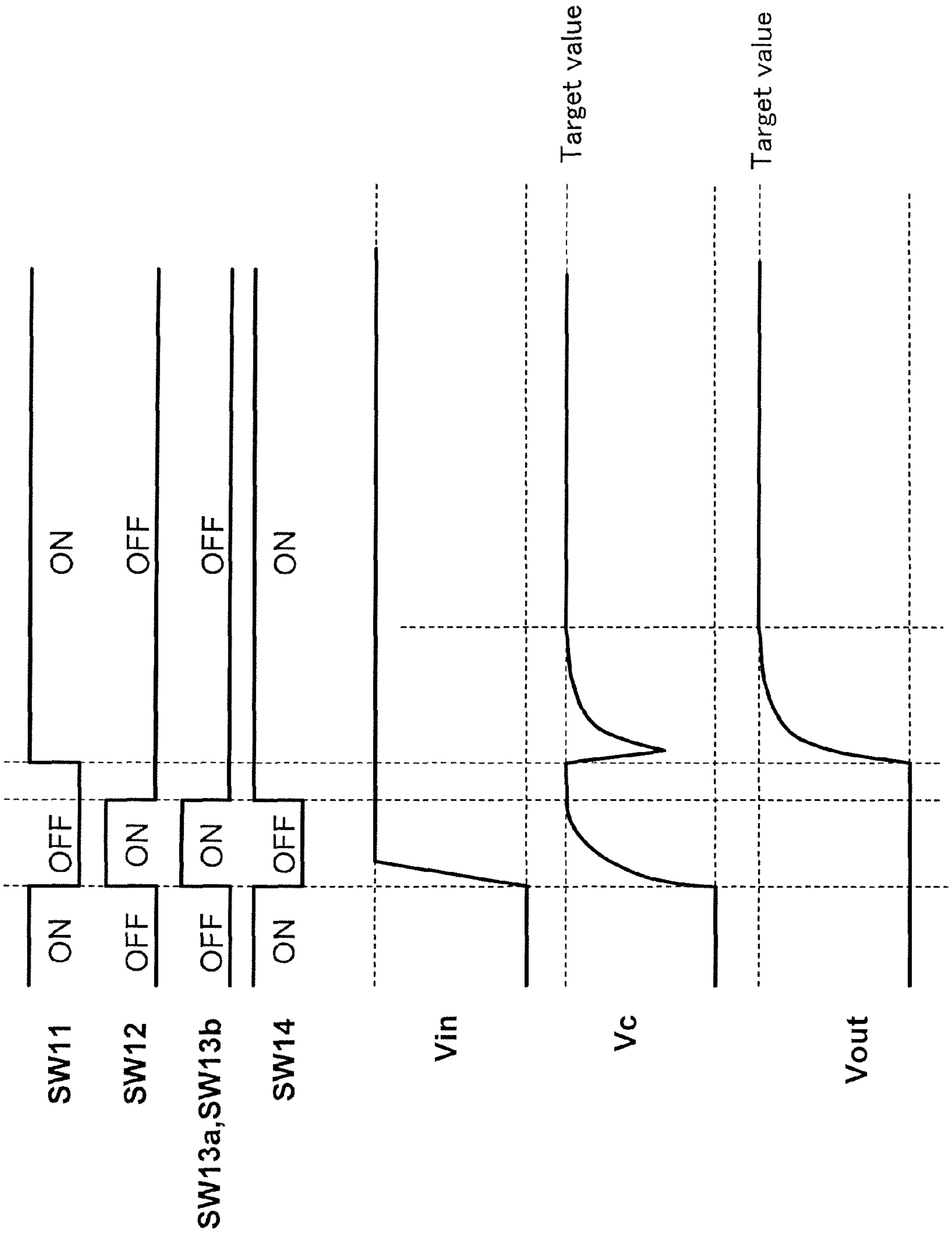
FIG. 12 is a timing chart for describing an example of an ON/OFF operation of each switch.

While in the first to fifth embodiments reference has been made to FIG. 2 in describing the timing for turning on/off the switches, the switches may be turned on/off in the manner shown in FIG. 12. For example, in the display driver circuit 10 shown in FIG. 1, the input switch SW12 and the supply switches SW13*a* and SW13*b* are turned into an OFF state from an ON state before the output switch SW11 is turned into an ON state from an OFF state. That is, before the intermediate node nc (connection node of the phase compensation capacitances C103*a* and C103*b*) is brought into connection with the output terminal 104 after shift to the output mode, one end of the phase compensation capacitance C103*a* is separated from the power node Vcc (or node na), and one end of the phase compensation capacitances C103*b* is separated from the ground node Vss (or node nb) so that the intermediate node nc is separated from the input terminal 101.

This enables it to inhibit a change in voltage at the one end (supply node n14*a*) of the phase compensation capacitance C103*a* and at the one end (supply node n14*b*) of the phase compensation capacitance C103*b* before the voltage Vc of the intermediate node is output as the output voltage Vout, which enables it to change the voltage value of the output voltage further more rapidly.

(Sixth Embodiment)

<Structure>

Figure 13:
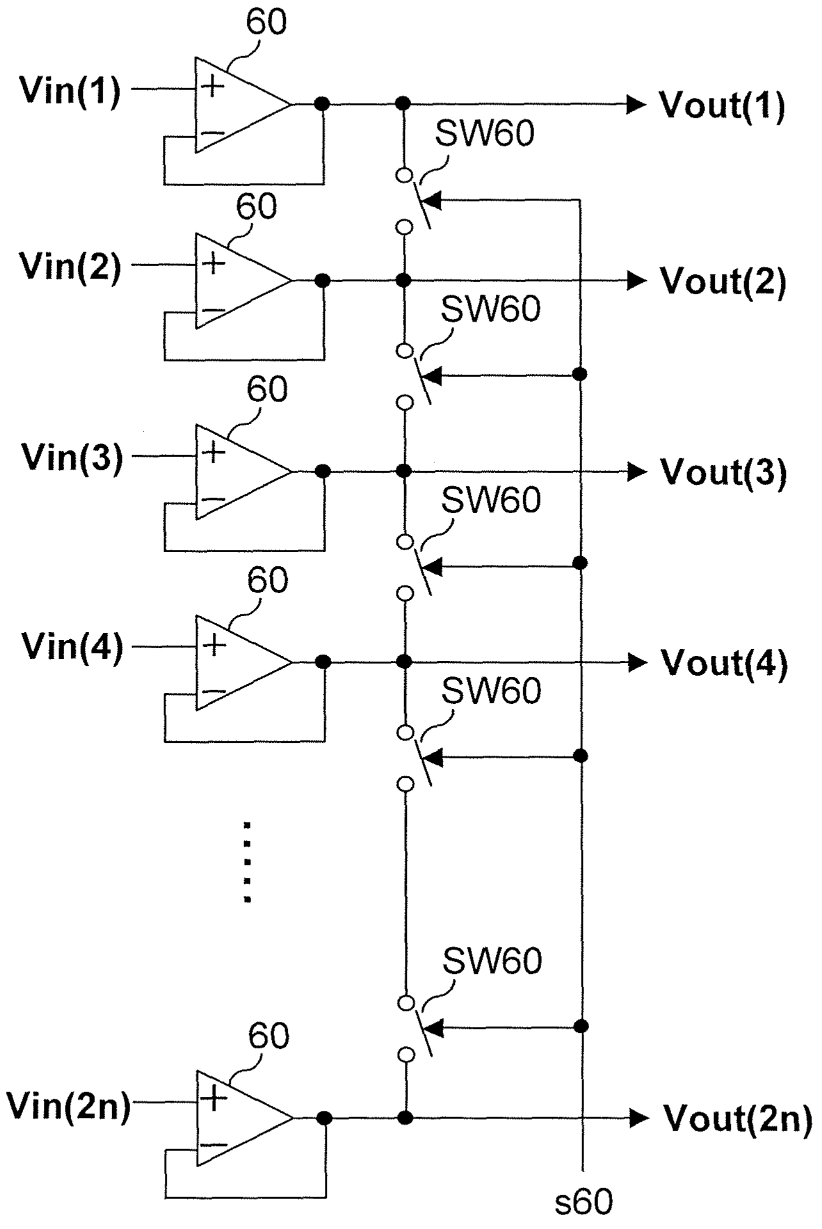
FIG. 13 is a circuit diagram showing a structure of a display driver according to a sixth embodiment of this invention.

FIG. 13 shows a structure of a display driver according to a sixth embodiment of this invention. This driver has 2*n* (n being a natural number) display driver circuits 60 and (2*n*−1) distribution switches 60. This display driver drives the display panel by supplying mutually different output voltages to odd-numbered vertical lines and even-numbered vertical lines (e.g., the dot inversion driving system and frame inversion driving system).

Each of the 2*n* display driver circuits 60 receives an input voltage with a polarity different from the polarity of input voltages supplied to the adjacent display driver circuits 60. That is, when input voltages Vin(1), Vin(3), . . . , Vin(2*n*−1), which are supplied to the odd-numbered display driver circuits, have a "negative" polarity, then input voltages Vin(2), Vin(4), . . . , Vin(2$n$), which are supplied to the even-numbered display driver circuits, have a "positive" polarity.

Also, the 2$n$ display driver circuits 60 output output-voltages Vout(1), Vout(2), . . . , Vout(2$n$) respectively in response to input voltages Vin(1), Vin(2), . . . , Vin(2$n$). For example, when the polarity of the output voltage Vout (2$n$−1), which is supplied from the odd-numbered display driver circuit 60, is "negative", then the polarity of the output voltage Vout (2$n$), which is supplied from the even-numbered display driver circuit 60, is "positive".

The polarity of each of the 2$n$ input voltages Vin(1), Vin(2), . . . , Vin(2$n$) is inversed at a predetermined timing. For example, in the case of the dot inversion driving system, the polarities of the 2$n$ input voltages are inversed at every horizontal line period. It is assumed here that the polarity of the input voltage is inversed upon shift to the transition mode.

The distribution switch 60 is connected between the output terminals of two adjacent display driver circuits 60. The distribution switch 60 is turned off in the output mode and turned on in the transition mode. That is, the distribution switch 60 is turned on when the polarity of each of the input voltages Vin(1), Vin(2), . . . , Vin(2$n$) is inversed.

In the output mode, the first display driver circuit 60, for example, has the output terminal thereof disconnected from the output terminal of the second display driver circuit 60 while outputting the output voltage Vout(1) in response to the input voltage Vin(1). In the transition mode, the first display driver circuit 60 brings the output terminal thereof into connection with the output terminal of the second display driver circuit 60 while the polarity of the supplied input voltage Vin(1) is inversed.

<Structure of the Display Driver Circuit>

Figure 14:
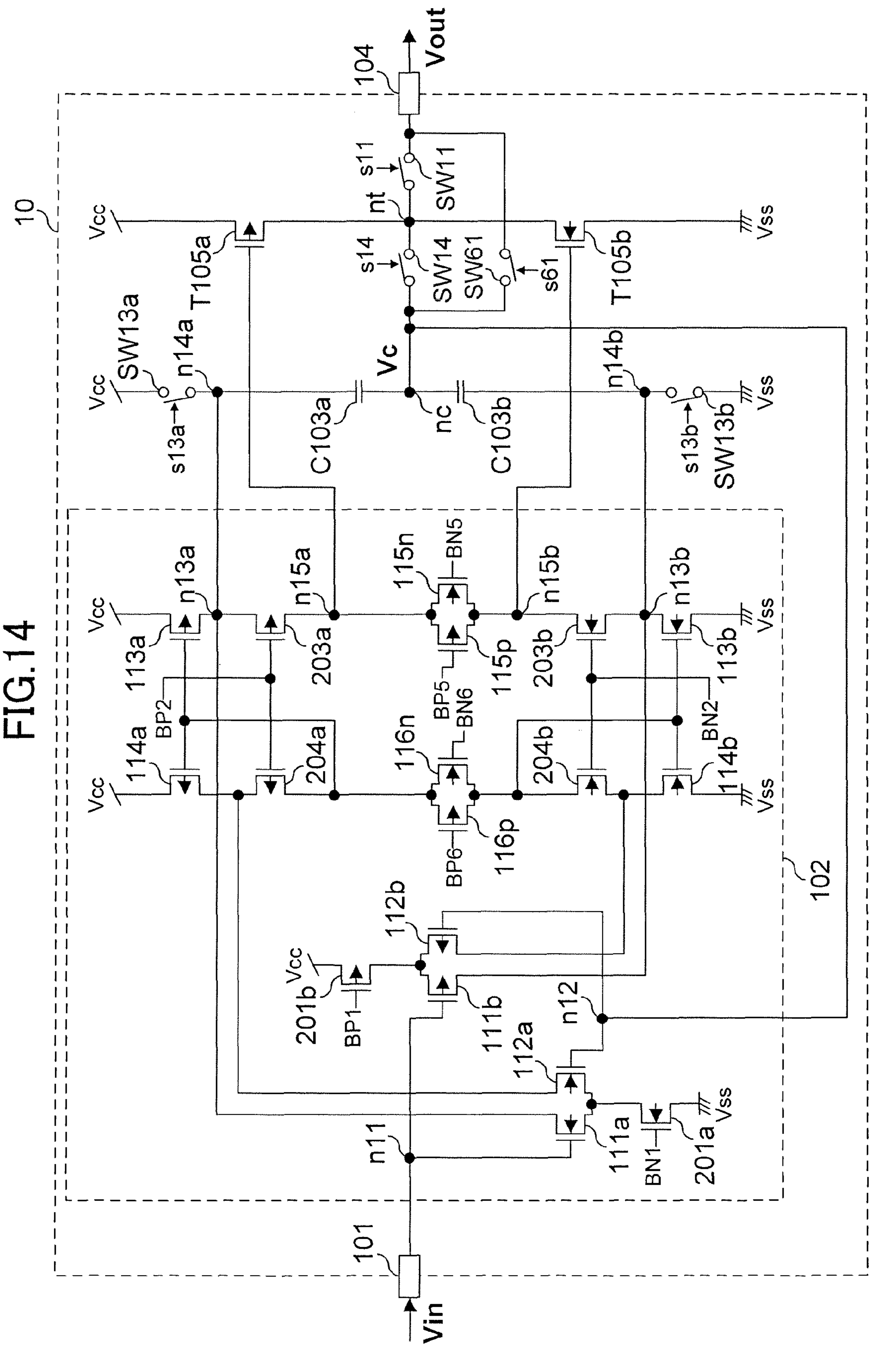
FIG. 14 is a circuit diagram showing a structure of a display driver circuit shown in FIG. 13.

FIG. 14 shows a structure of the display driver circuit 60 shown in FIG. 13, where the input voltage is indicated as "Vin", the capacitance voltage is indicated as "Vc", and the output voltage is indicated as "Vout". This circuit 60 has a connection switch 61 in place of the input switch SW11 shown in FIG. 1. The connection switch 61 is connected between the intermediate node nc and the output terminal 104. The connection switch 61 is controlled by a control signal s61 from, for example, a control circuit (not shown) to be turned on/off. The timing for turning on/off the connection switch 61 is similar to the case of the input switch SW12 shown in FIG. 1.

<Operation>

Figure 15:
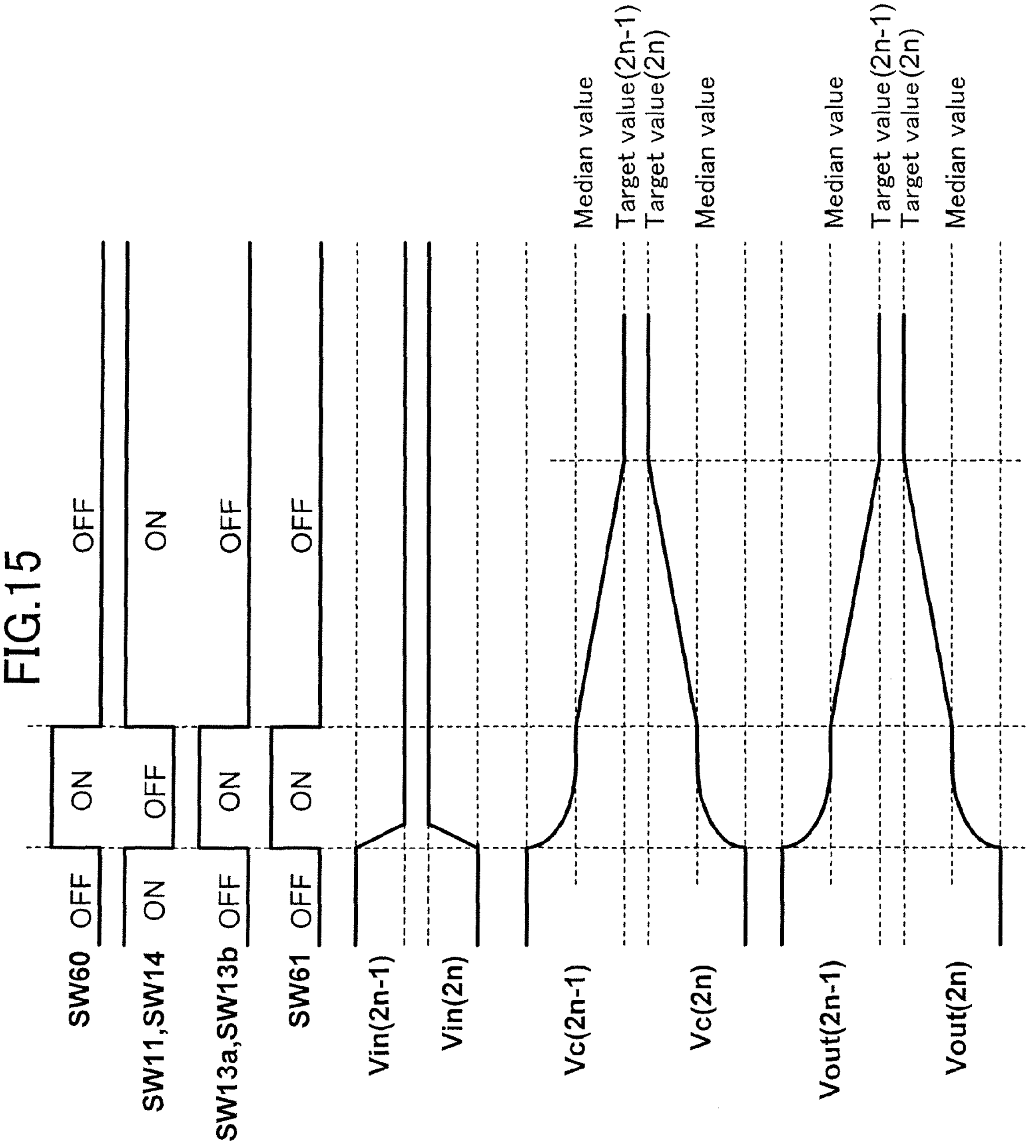
FIG. 15 is a timing chart for describing operation of the display driver circuit shown in FIG. 14.

Operation of the display driver circuit 60 shown in FIG. 14 will be described with reference to FIG. 15. FIG. 15 shows a change in an input voltage Vin(2$n$−1), a capacitance voltage Vc(2$n$−1), and an output voltage Vout(2$n$−1) at a (2$n$−1)th display driver circuit, and a change in an input voltage Vin (2$n$), a capacitance voltage Vc(2$n$), and an output voltage Vout(2$n$) at a (2$n$)th display driver circuit.

[Output Mode]

First, the display driver circuit 60 is assumed to be in the "output mode". In this case, the output switch SW11 and the connection switch SW14 are turned on, and the connection switch SW61 and the supply switches SW13$a$ and SW13$b$ are turned off. At the intermediate node nc, the voltage (capacitance voltage) Vc occurs with a voltage value corresponding to the input voltage Vin, and the output terminal 104 outputs the output voltage Vout with a voltage value corresponding to the input voltage Vin. The input voltage Vin(2$n$−1) and the output voltage Vout(2$n$−1) are positive, while the input voltage Vin(2$n$) and the output voltage Vout(2$n$) are negative.

[Transition Mode]

Next, the display driver circuit 60 shifts to the "transition mode". In this case, in the display driver, the distribution switches SW60 are turned on to connect the output terminals of the 2$n$ display driver circuits 60 to each other, thus distributing accumulated electric charge to the output terminals.

This electric charge distribution causes the output terminal 104 of for example, the (2$n$−1)th display driver circuit to be discharged to decrease the voltage value of the output voltage Vout(2$n$−1) to a median value. Meanwhile, the output terminal 104 of the (2$n$)th display driver circuit is charged to increase the voltage value of the output voltage Vout(2$n$) to a median value. Thus, the voltage value of each output voltage is rendered a median value.

Also, in each of the 2$n$ display driver circuits 60, the output switch SW11 and the connection switch SW14 are turned off, and the connection switch SW61 and the supply switches SW13$a$ and SW13$b$ are turned on. To the input terminal 101 is supplied a new input voltage Vin with an inversed polarity. Here the input voltage Vin(2$n$−1) is turned negative and the input voltage Vin(2$n$) is turned positive.

Here the supply node n14$a$ is brought into connection with the power node Vcc so that one end of the phase compensation capacitance C103$a$ receives voltage from the power node Vcc. Also, the supply node n14$b$ is brought into connection with the ground node Vss so that one end of the phase compensation capacitance C103$b$ receives voltage from the ground node Vss. Further, the intermediate node nc is brought into connection with the output terminal 104 so that the phase compensation capacitances C103$a$ and C103$b$ receive the output voltage Vout (median value) of the output terminal 104.

The phase compensation capacitances C103$a$ and C103$b$ charge or discharge electric charge corresponding to the voltage value of the output voltage Vout. In accordance with this charging or discharging of electric charge, the voltage value of the capacitance voltage Vc at the intermediate node nc changes. Since the voltage from the power node Vcc and the ground node Vss has a lower impedance, the charging or discharging rate of electric charge at the phase compensation capacitances C103$a$ and C103$b$ is higher than in the output mode. This makes quick the movement of electric charge between the intermediate node nc and the output terminal 104. That is, the voltage value of the capacitance voltage Vc can be rapidly changed to the voltage value (median) of the output voltage Vout. Also, since the intermediate node nc and the output terminal 104 are connected to each other, the voltage value of the capacitance voltage Vc and the voltage value of the output voltage Vout become equal to each other.

[Output Mode]

Next, the display driver circuit 60 shifts from the "transition mode" to the "output mode". In this case, the output switch SW11 and the connection switch SW14 are turned on, and the connection switch SW61 and the supply switches SW13$a$ and SW13$b$ are turned off.

The intermediate node nc is brought into connection with the output terminal 104 through the connection switch SW14, the node nt of the output circuit, and the output switch SW11. Since the voltage value of the output voltage Vout of the output terminal 104 is equal to the voltage value of the capacitance voltage Vc at the intermediate node nc, there is no charging or discharging of the output terminal 104 caused by a difference in voltage between the output voltage Vout and the capacitance voltage Vc. Thus, the voltage value of the output voltage Vout changes from the voltage value of the median voltage to a target value in accordance with the operation speed of the display driver circuit. For example, in the output mode, the voltage value of the output voltage Vout(2n−1) decreases from the "median value" to a "target value (2n−1)", and the voltage value of the output voltage Vout(2n) increases from the "median value" to a "target value (2n)".

Thus, in the transition mode, by connecting the intermediate node nc and the output terminal 104 to each other, the voltage value of the capacitance voltage Vc is rapidly changed to the median value, thus shortening the time required before the voltage value of the output voltage Vout reaches the target value.

<Effects>

Thus, the voltage value of the output voltage can be rapidly changed without increasing tail current or decreasing the capacitance value of the phase compensation capacitance.

Also, since there is no charging or discharging at the output terminal during shift from the transition mode to the output mode, distributed electric charge can be effectively reused. This reduces power consumption.

Further, current does not flow in large amounts in a short time, thus reducing EMI.

(Modified Example of the Sixth Embodiment)

Figure 16:
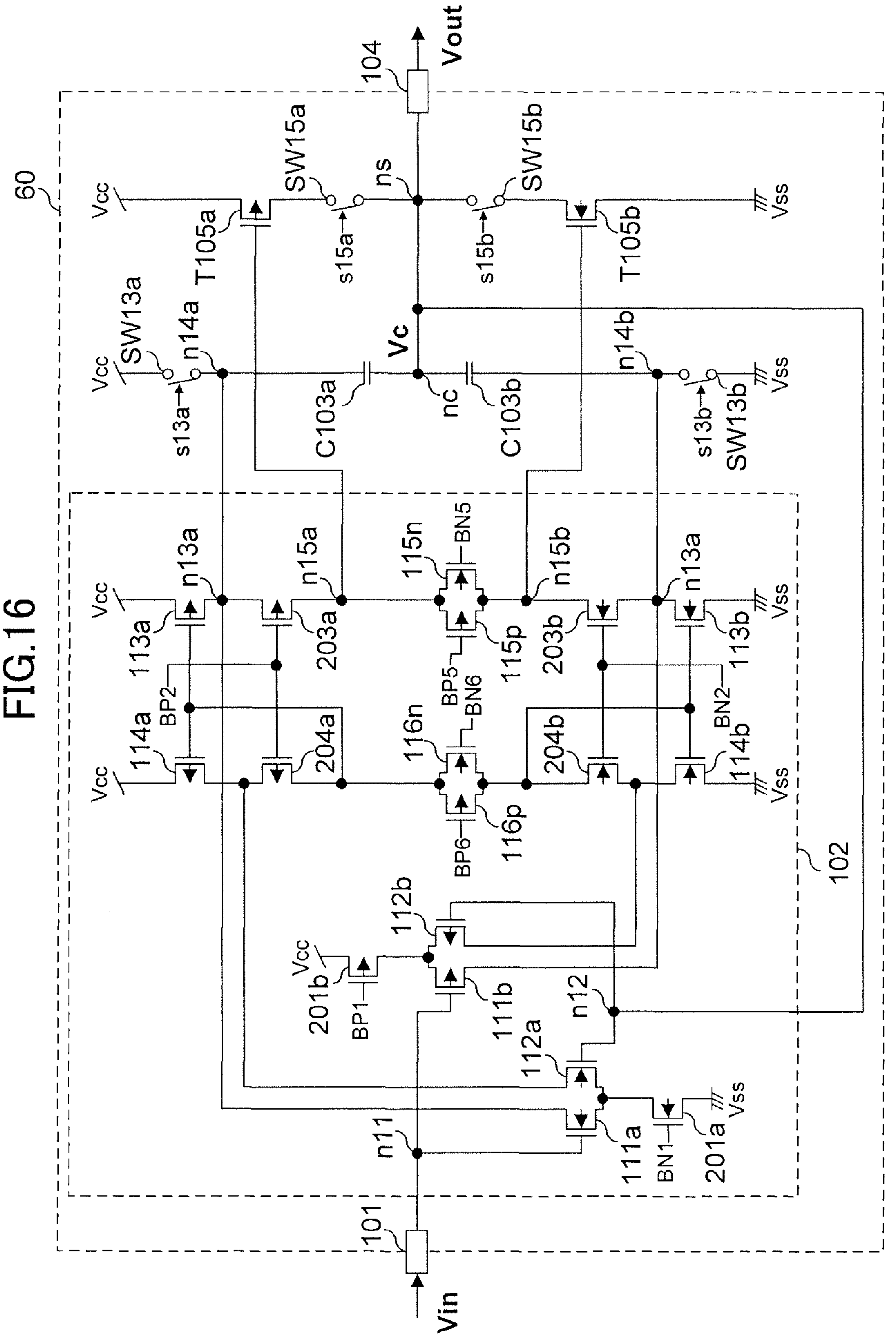
FIG. 16 is a circuit diagram showing a modified example of the display driver circuit shown in FIG. 14.

Similar advantageous effects are provided when, as shown in FIG. 16, the display driver circuit 60 has the connection switches SW15a and SW15b shown in FIG. 3 instead of the connection switch SW61 as shown in FIG. 14.

Also, similar advantageous effects are provided when, in the display driver circuit 60 shown in FIG. 16, the connection switch SW15a is connected between the power node Vcc and the driving transistor T105a, and the connection switch SW15b is connected between the driving transistor T105b and the ground node Vss. Further, similar advantageous effects are provided when, in the display driver circuit 60 shown in FIG. 16, the connection switch SW15a is connected between the node n15a and the gate of the driving transistor T105a, and the connection switch SW15b is connected between the node n15b and the gate of the driving transistor T105b. That is, in the transition mode, at least one of the source, drain, and gate of each of the driving transistors T105a and T105b is turned into a disconnected state.

(Seventh Embodiment)

<Structure>

Figure 17:
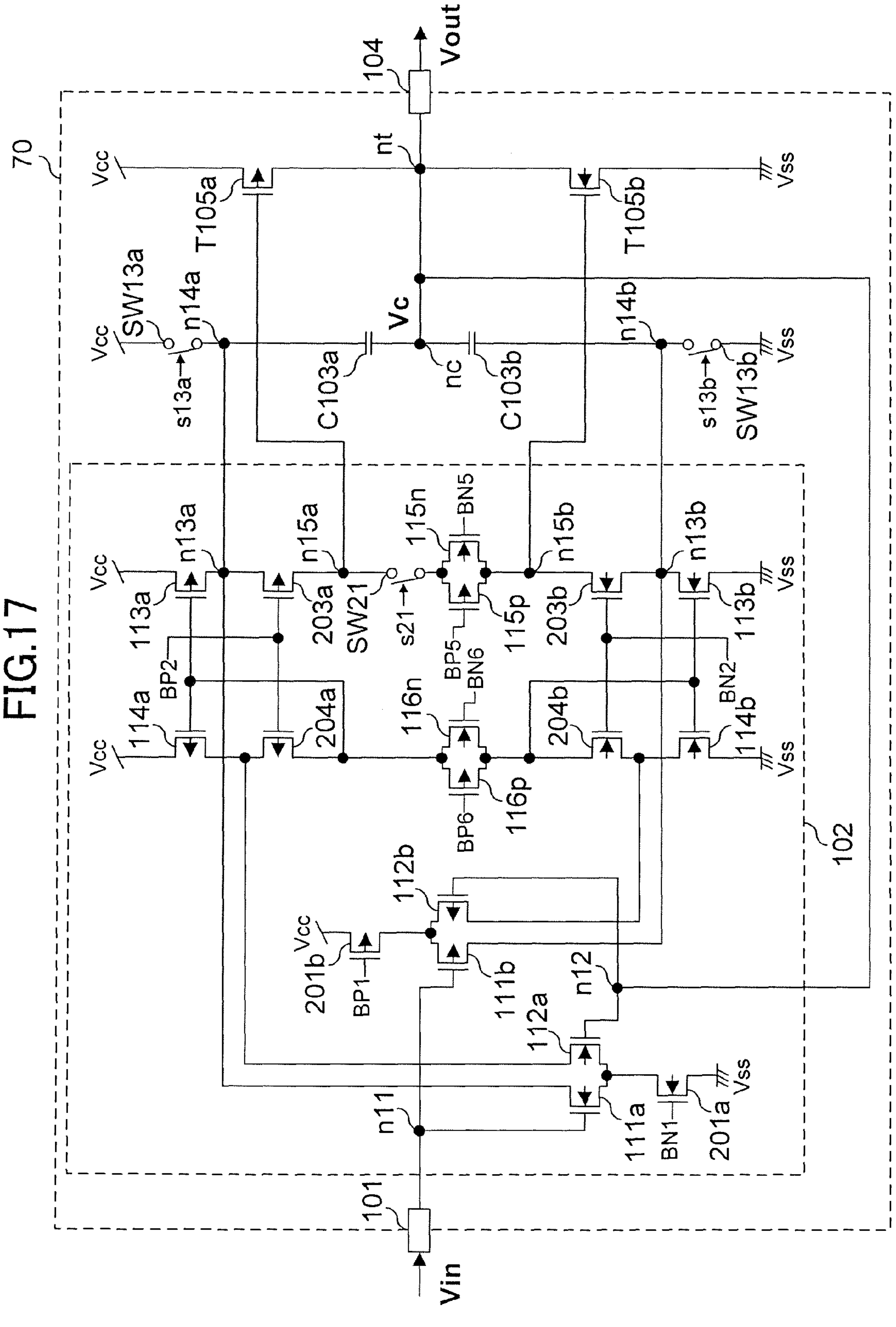
FIG. 17 is a circuit diagram showing a structure of a display driver circuit according to a seventh embodiment of this invention.

FIG. 17 shows a structure of a display driver circuit 70 according to a seventh embodiment of this invention. This circuit 70 has the connection switch SW21 shown in FIG. 4 in place of the output switch SW11 and the connection switches SW14 and SW61 shown in FIG. 14. The rest of the structure is similar to the case shown in FIG. 14.

<Operation>

Operation of the display driver circuit 70 shown in FIG. 17 is similar to the case of the display driver circuit 60 shown in FIG. 14. Also, operation associated with the connection switch SW21 is similar to the case shown in FIG. 4.

[Output Mode]

In the output mode, the connection switch SW21 is turned on and the driving transistors T105a and T105b become activated so that an idling current flows through the output circuit.

[Transition Mode]

In the transition mode, the connection switch SW21 is turned off and the driving transistors T105a and T105b become inactivated so that no idling current flows through the output circuit.

<Effects>

Thus, the voltage value of the output voltage can be rapidly changed, and power consumption can be reduced. Also, the number of switches is small as compared with the display driver circuit 60 shown in FIGS. 14 and 16, resulting in a reduction in circuit size.

(Modified Example of the Seventh Embodiment)

Figure 18:
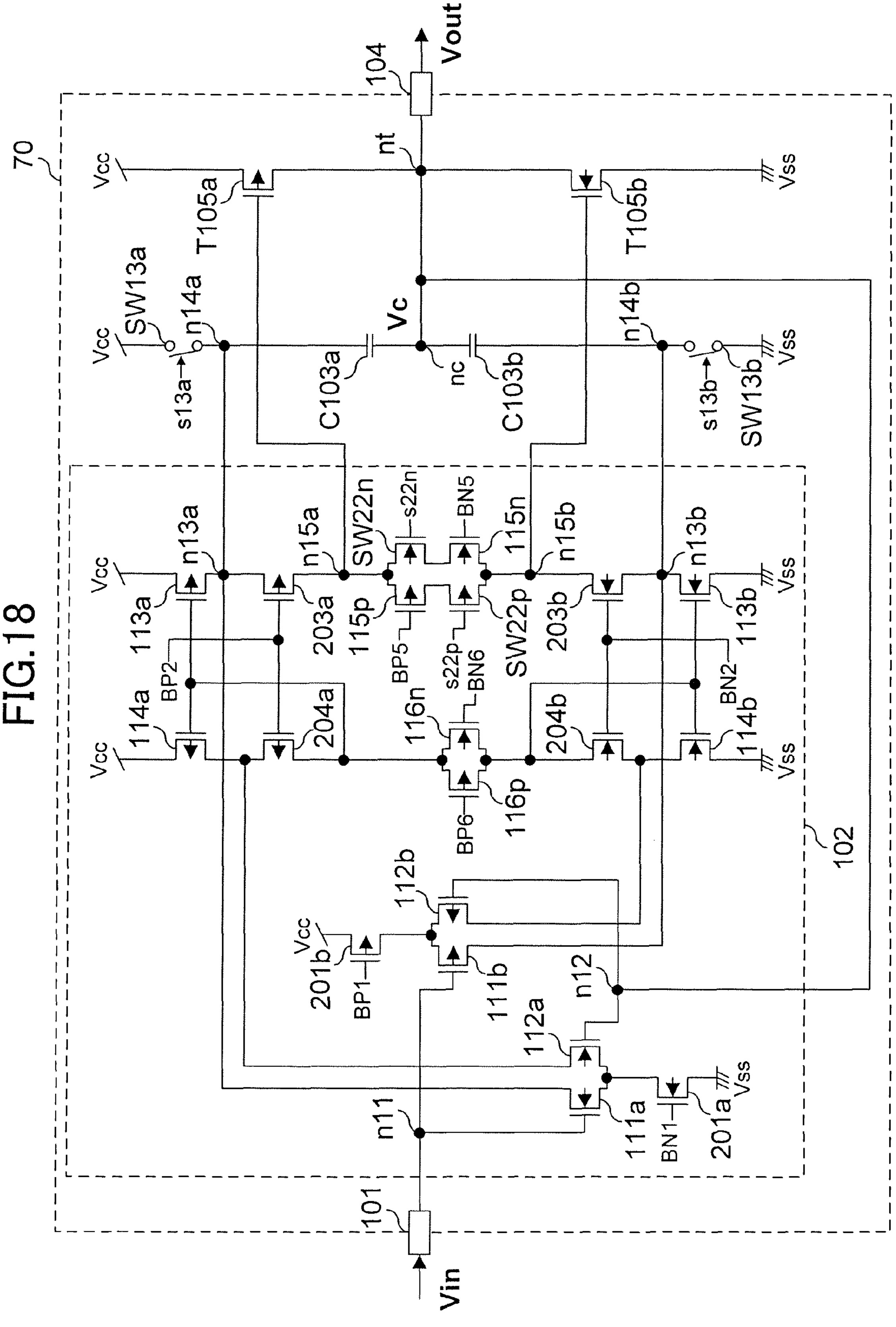
FIG. 18 is a circuit diagram showing a modified example of the display driver circuit shown in FIG. 17.

Similar advantageous effects are provided when, as shown in FIG. 18, the display driver circuit 70 has the connection transistors SW22n and SW22p shown in FIG. 5 in place of the connection switch SW21. This structure, similarly to the case shown in FIG. 5, enables it to equalize the source-gate voltage of each of the connection transistors SW22n and SW22p to the case where the connection transistors SW22n and SW22p are not connected (e.g., the case of FIG. 14). This in turn enables it to inhibit dislocation of the operation point of the differential amplification part 102.

(Eighth Embodiment)

<Structure>

Figure 19:
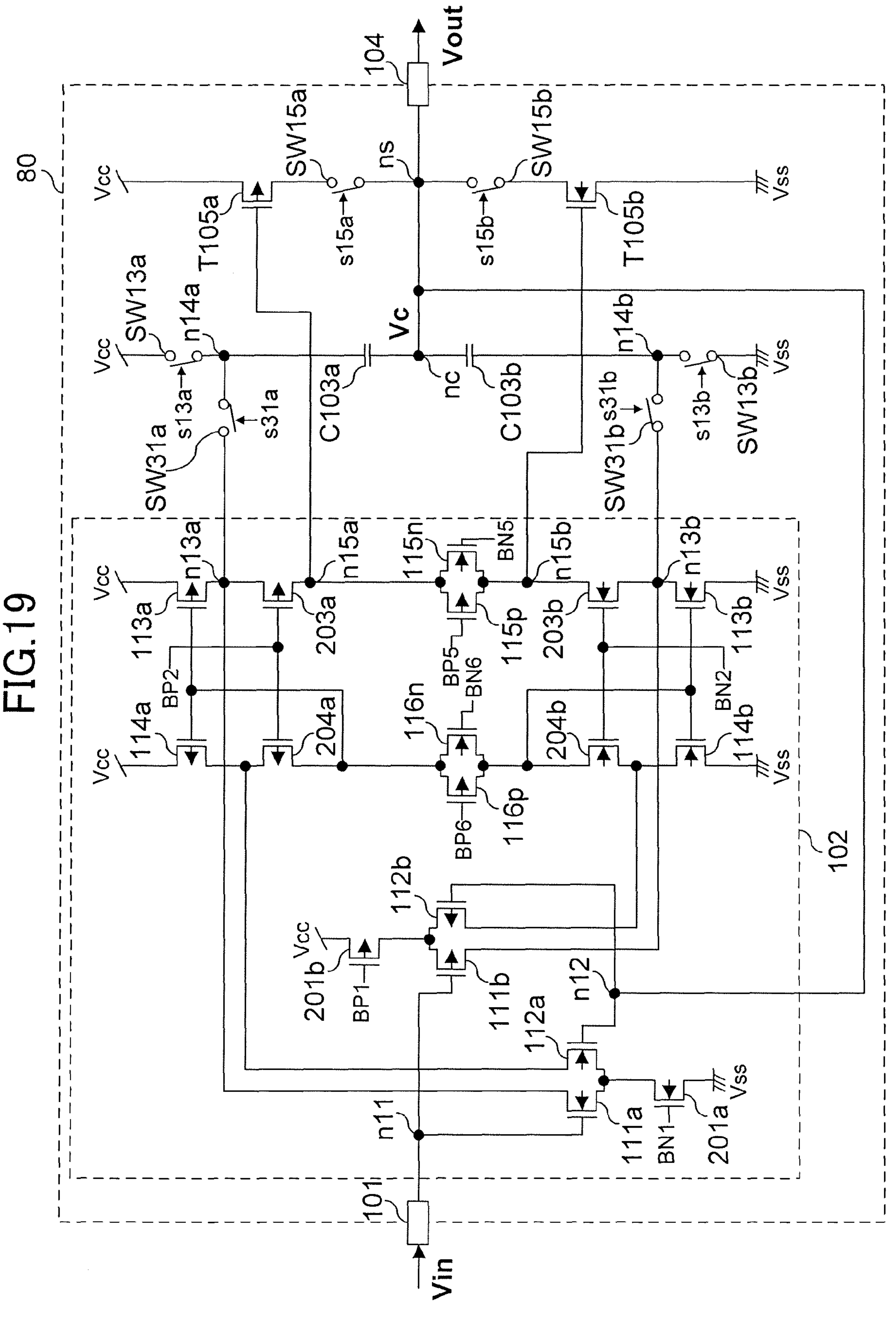
FIG. 19 is a circuit diagram showing a structure of a display driver circuit according to an eighth embodiment of this invention.

FIG. 19 shows a structure of a display driver circuit 80 according to an eighth embodiment of this invention. This circuit 80 has the switches SW31a and SW31b shown in FIG. 6 in addition to the display driver circuit 60 shown in FIG. 16.

<Operation>

Operation of the display driver circuit 80 shown in FIG. 19 is similar to the case of the display driver circuit 60 shown in FIG. 16. Also, operation associated with the switches SW31a and SW31b is similar to the case shown in FIG. 6.

[Output Mode]

In the output mode, the switches SW31a and SW31b are turned on. Also, the supply switches SW13a and SW13b are turned off. This makes the phase compensation capacitance C103a receive voltage from the output node n13a and makes the phase compensation capacitance C103b receive voltage from the output node n13b.

[Transition Mode]

In the transition mode, the switches SW31a and SW31b are turned off. Also, the supply switches SW13a and SW13b are turned on. This allows no through-current to flow through the node n14a and the output node n13a, and between the output node n13b and the node n14b.

<Effects>

Thus, the voltage value of the output voltage can be rapidly changed, and power consumption can be reduced. It should be noted that the switches SW31a and SW31b are applicable to the display driver circuit shown in FIG. 14.

(Ninth Embodiment)

<Structure>

Figure 20:
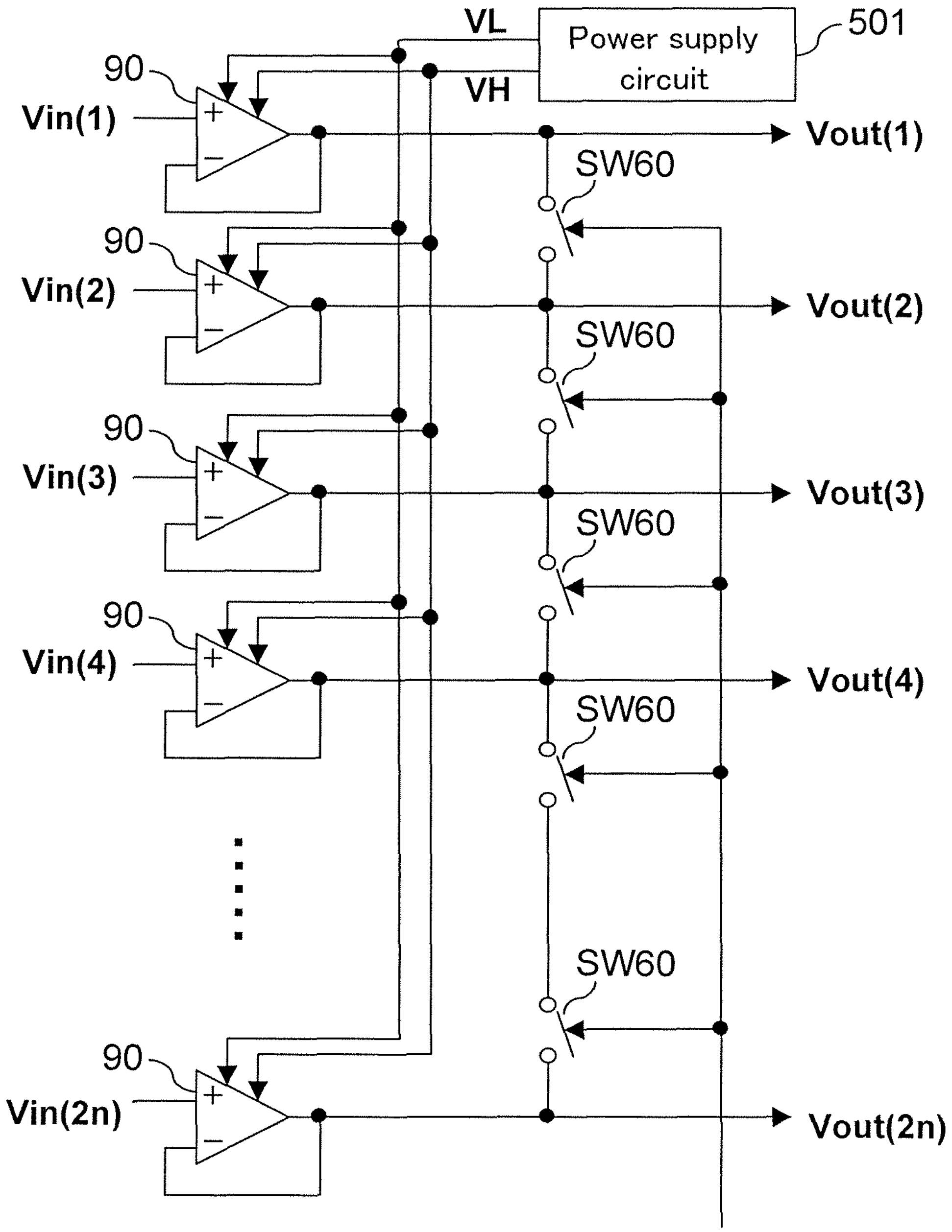
FIG. 20 is a circuit diagram showing a structure of a display driver according to a ninth embodiment of this invention.

FIG. 20 shows a structure of a display driver according to a ninth embodiment of this invention. This driver has 2n display driver circuits 90 in place of the 2n display driver circuits 60 shown in FIG. 13, and further has the power supply circuit 501 shown in FIG. 10. The rest of the structure is similar to the case shown in FIG. 13. Each of the display driver circuits 90 receives stability voltages VH and VL from the power supply circuit 501.

<Structure of the Display Driver Circuit>

Figure 21:
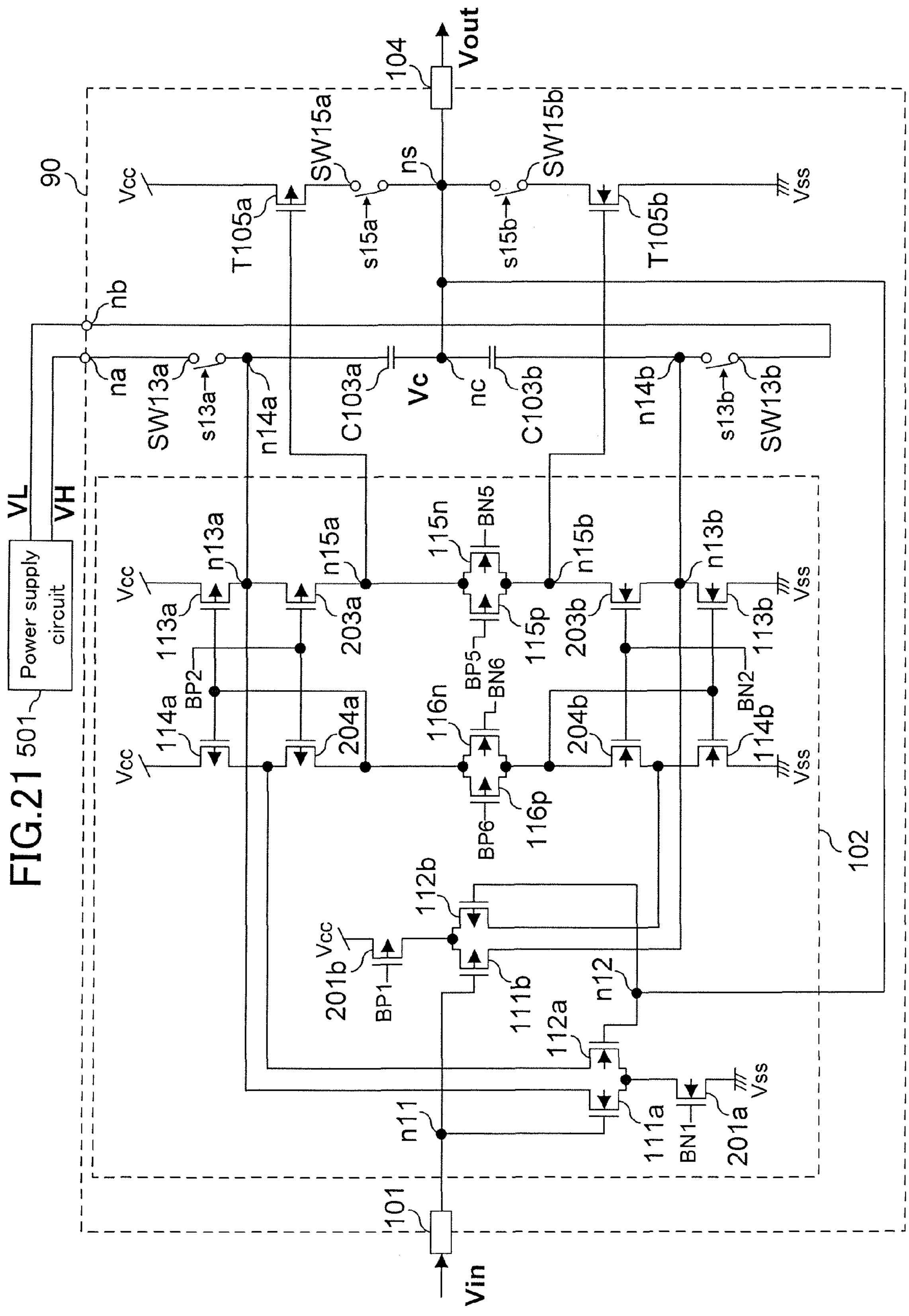
FIG. 21 is a circuit diagram showing a structure of a display driver circuit shown in FIG. 20.

FIG. 21 shows a structure of the display driver circuit 90 shown in FIG. 20. This circuit 90 has the nodes na and nb shown in FIG. 10 in place of the power node Vcc, which is led to the supply switch SW13a, and of the ground node Vss, which is led to the supply switch SW13b, shown in FIG. 16. The rest of the structure is similar to the case shown in FIG. 16.

<Operation>

Operation of the display driver circuit 90 shown in FIG. 21 is similar to the case of the display driver circuit 60 shown in FIG. 16. Also, operation associated with the power supply circuit 501 is similar to the case shown in FIG. 10.

In the transition mode, the stability voltage VH from the node na is supplied to the supply node n14a so that a change in voltage at the supply node n14a during shift from the transition mode to the output mode is inhibited. Also, the stability voltage VL from the node nb is supplied to the supply node n14$b$ so that a change in voltage at the supply node n14$b$ during shift from the transition mode to the output mode is inhibited. This makes further more rapid the charging or discharging of electric current at the phase compensation capacitances C103$a$ and C103$b$.

<Effects>

Thus, the voltage value of the voltage Vc of the intermediate node can be changed further more rapidly, thus enabling it to change the voltage value of the output voltage further more rapidly. It should be noted that the power supply circuit 501 is applicable to the display driver circuits shown in FIGS. 14, 17, 18, and 19.

(On/Off Timing)

Figure 22:
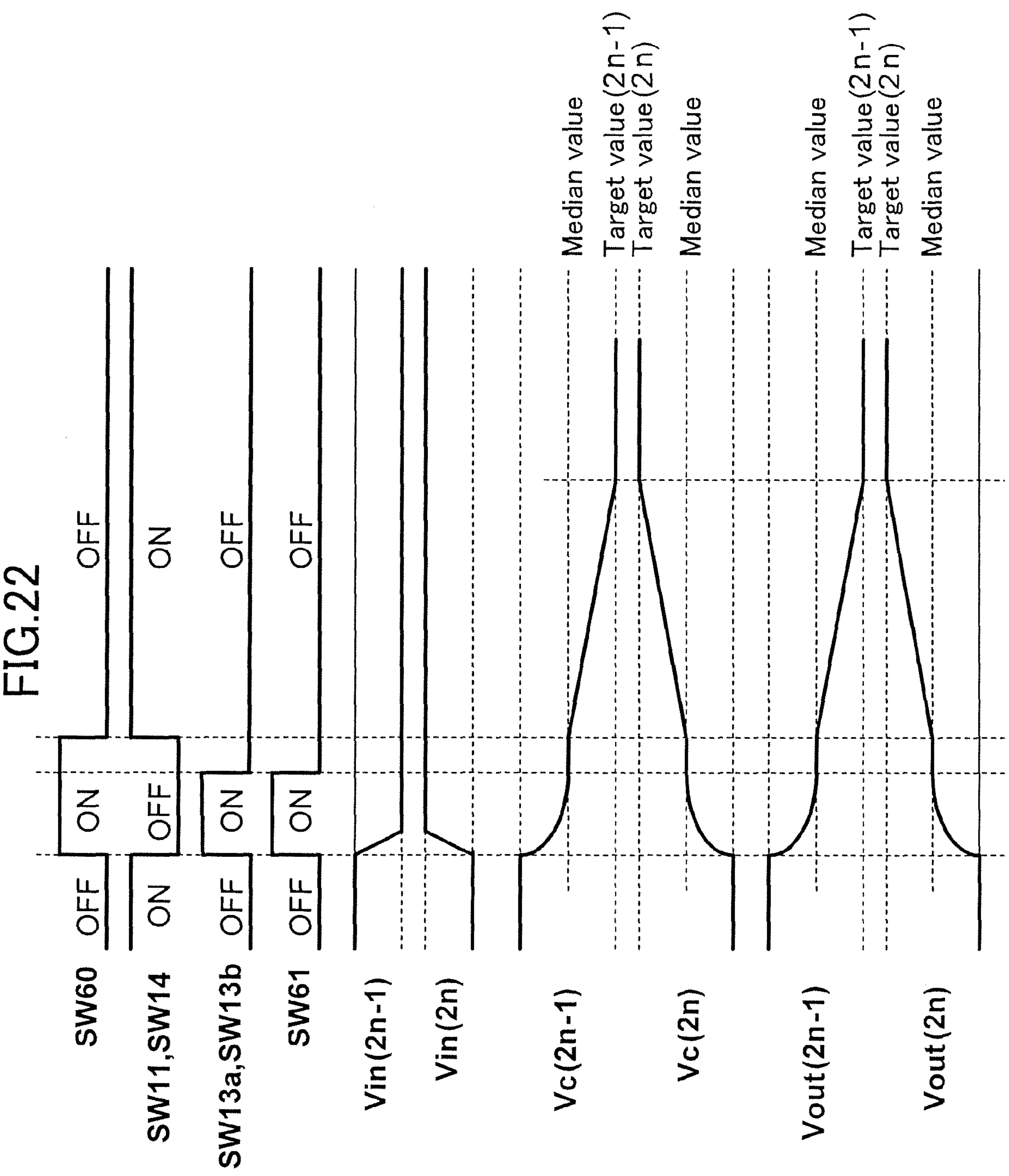
FIG. 22 is a timing chart for describing an example of an ON/OFF operation of each switch.

While in the sixth to ninth embodiments reference has been made to FIG. 15 in describing the timing for turning on/off the switches, the switches may be turned on/off in the manner shown in FIG. 22. For example, in the display driver circuit shown in FIG. 14, the connection switch SW61 and the supply switches SW13$a$ and SW13$b$ are turned into an OFF state from an ON state before the distribution switch SW60 is turned into an OFF state from an ON state. That is, before completion of electric current redistribution by the distribution switch SW60, one end of the phase compensation capacitance C103$a$ is separated from the power node Vcc (or node na), and one end of the phase compensation capacitances C103$b$ is separated from the ground node Vss (or node nb). This secures that when the distribution switch SW60 is turned off upon shift to the output mode, the voltages at the one end (supply node n14$a$) of the phase compensation capacitance C103$a$ and at the one end (supply node n14$b$) of the phase compensation capacitance C103$b$ are stable, thus enabling it to make further more rapid a change in the voltage value of the output voltage.

Figure 23:
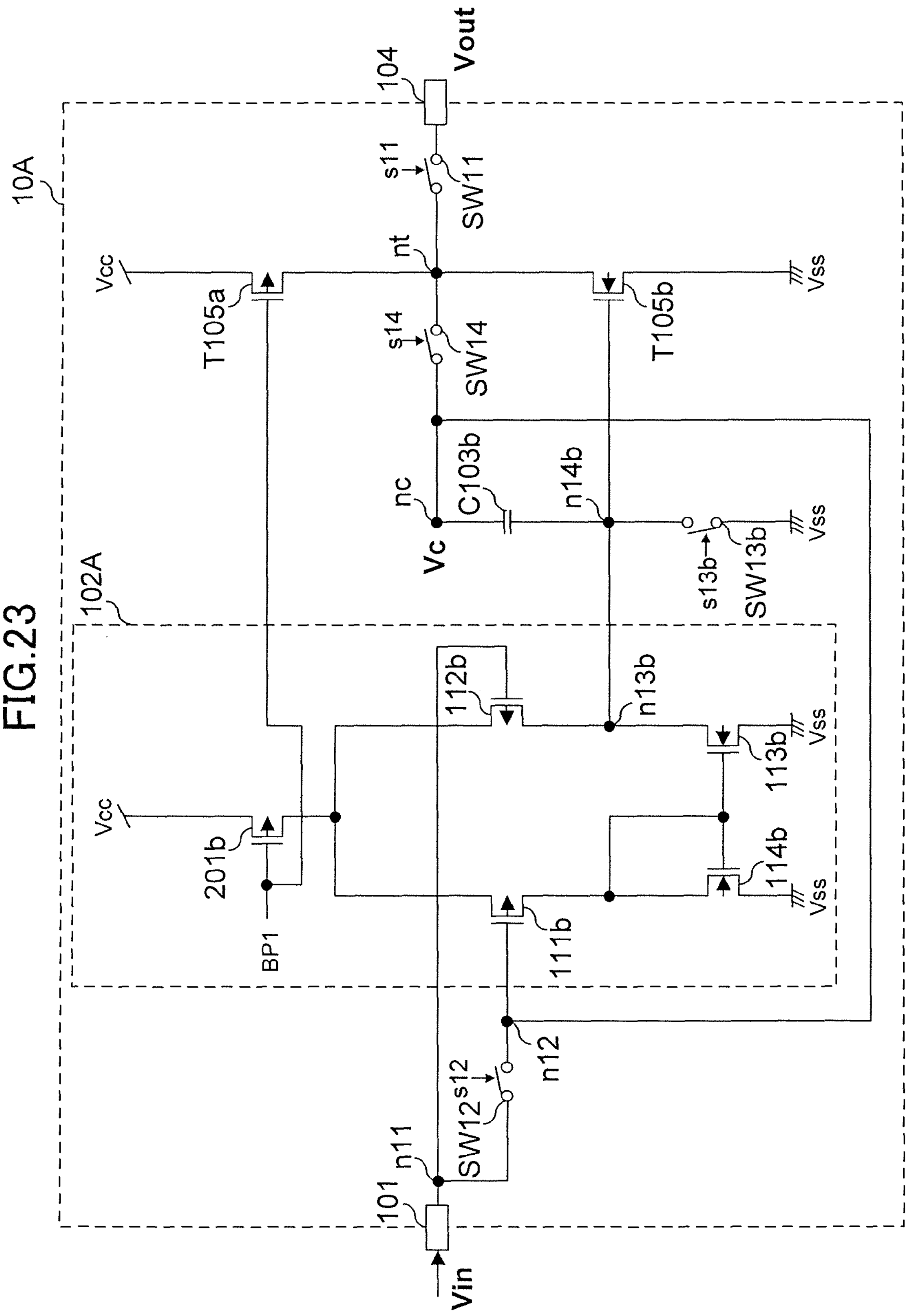
FIG. 23 is a circuit diagram showing a modified example of the display driver circuit shown in FIG. 1.
Figure 24:
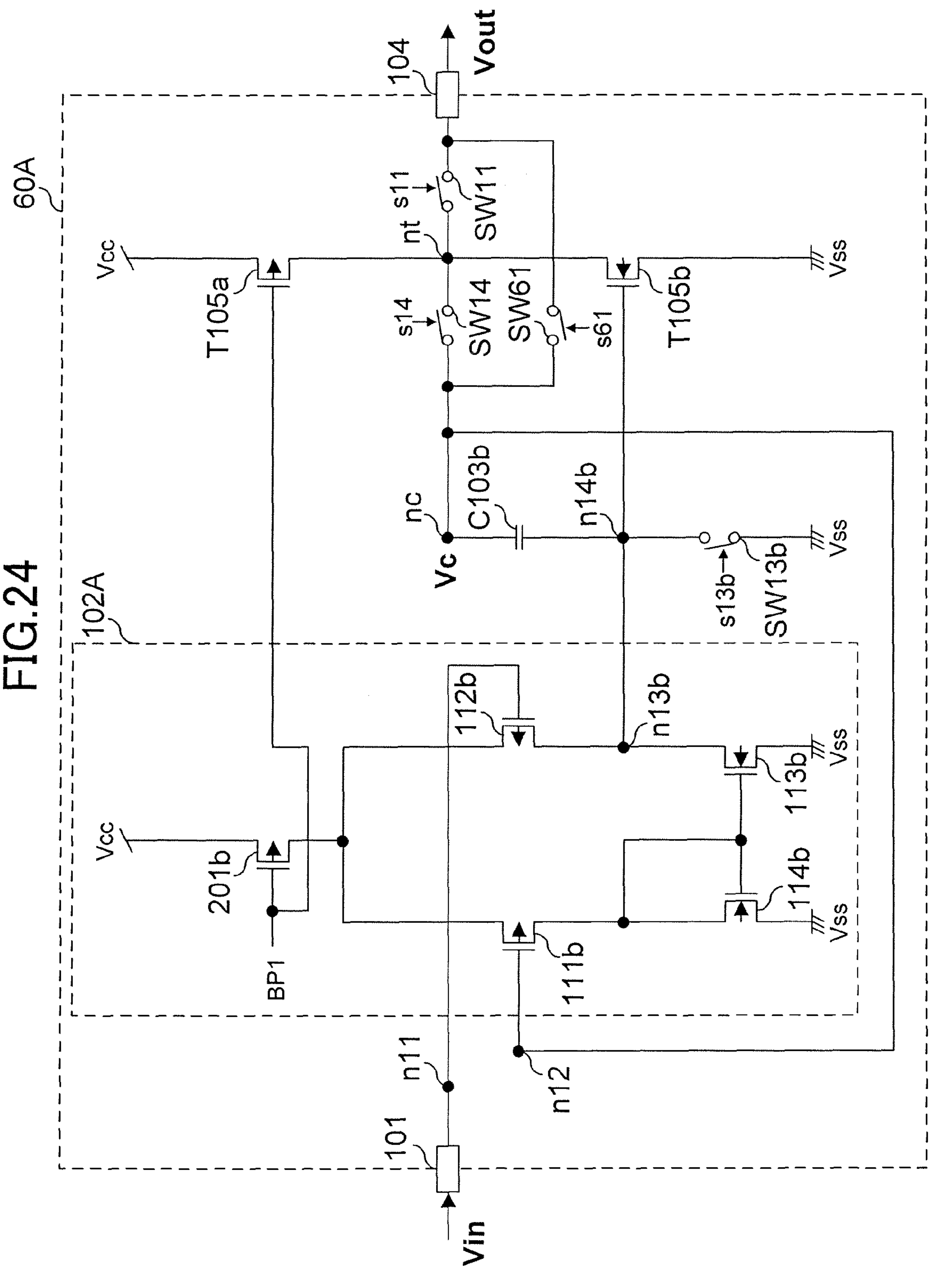
FIG. 24 is a circuit diagram showing a modified example of the display driver circuit shown in FIG. 14.
Figure 25:
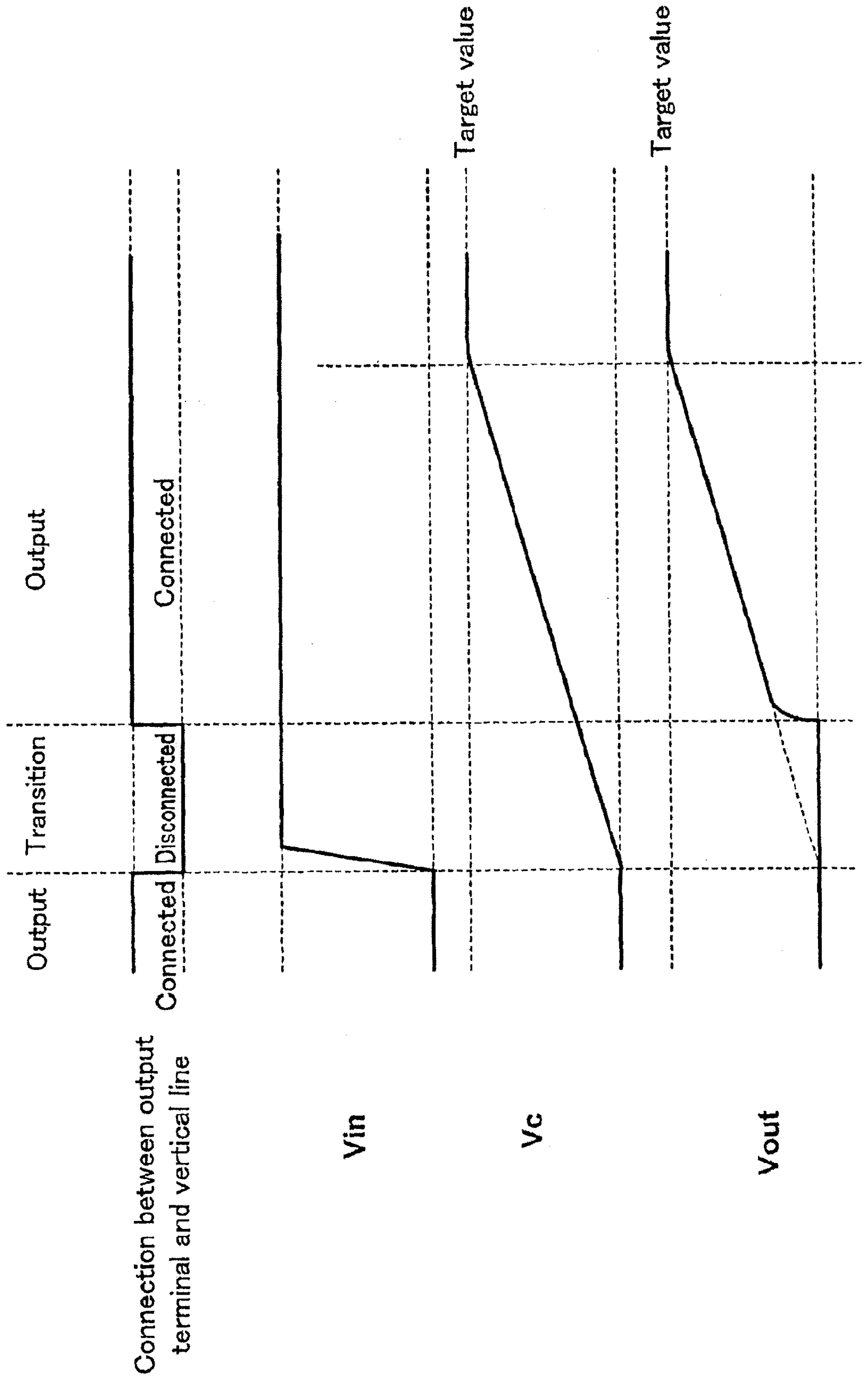
FIG. 25 is a timing chart for describing operation of a conventional display driving circuit.
Figure 26:
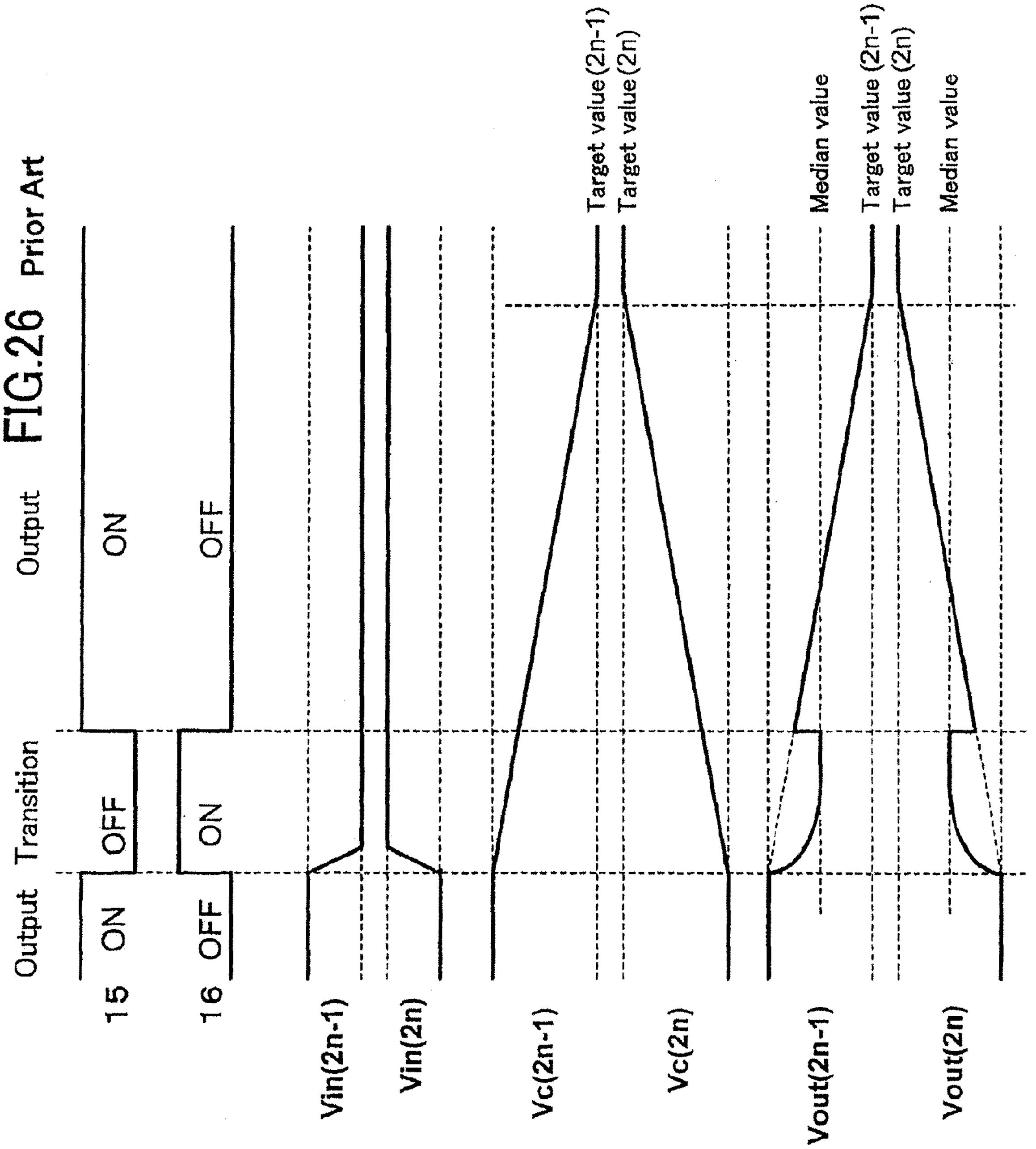
FIG. 26 is a timing chart for describing operation of a conventional electric charge distribution-type display driving circuit.

While in the description of the above embodiments the differential amplification part 102 of each display driver circuit is on a two-input and two-output basis, similar advantageous effects are provided when a two-input and one-output differential amplification part is used. For example, referring to FIG. 23, a display driver circuit 10A may have an input terminal 101, a two-input and one-output differential amplification part 102A, a single phase compensation capacitance C103$b$, an output terminal final 104, driving transistors T105$a$ and T105$b$, an output switch SW11, an input switch SW12, a single supply switch SW13$b$, and a connection switch SW14. Also, referring to FIG. 24, a display driver circuit 60A may have an input terminal 101, a two-input and one-output differential amplification part 102A, a single phase compensation capacitance C103$b$, an output terminal 104, driving transistors T105$a$ and T105$b$, an output switch SW11, a single supply switch SW13$b$, and connection switches SW14 and SW61. While the differential amplification parts shown in FIGS. 23 and 24 are each composed of an NMOS-type transistor, a PMOS-type transistor may of course be used.

In the above embodiments, each switch may be configured of a PMOS-type transistor, an NMOS-type transistor, or a CMOS-type transfer gate. Also, to one end of the supply switch SW13$a$, a constant current source may be connected in place of the power node Vcc. To one end of the supply switch SW13$b$, a constant current source may be connected in place of the ground node Vss.

Also, to each of the nodes n14$a$ and n14$b$, a constant current source switchable between a driving state and a suspension state may be connected in place of the supply switches SW13$a$ and SW13$b$. In this case, these constant current sources are turned into the suspension state in the output mode, and turned into the driving state in the transition mode.

INDUSTRIAL APPLICABILITY

The present invention is capable of rapidly changing the voltage value of the output voltage, and, therefore, is useful for display driver circuits for driving the display panels of liquid crystal panels, and the like.

The invention claimed is:

1. A display driver circuit including an input terminal to which an input voltage is supplied, an output terminal for outputting an output voltage to a vertical line of a display panel, an output mode in which the output voltage is supplied in response to the input voltage, and a transition mode in which a voltage value of the input voltage is changed, the display driver circuit comprising:

a differential amplification part having a first input node connected to the input terminal, a second input node, and a first output node, the differential amplification part outputting a first voltage from the first output node, the first voltage corresponding to a difference in voltages supplied to the first and second input nodes;

a first capacitance element connected between a first supply node connected to the first output node of the differential amplification part and an intermediate node connected to the second input node of the differential amplification part;

an output part having an input-output node, a first driving transistor connected between a first reference node and the input-output node, and a second driving transistor connected between the input-output node and a second reference node, the output part supplying an output current generated by the first and second driving transistors to the intermediate node through the input- output node;

an output switch connected between the input-output node of the output part and the output terminal, the output switch being turned on in the output mode and turned off in the transition mode;

a first supply switch connected between the first supply node and a third reference node, the first supply switch being turned off in the output mode and turned on in the transition mode, a voltage supplied to the third reference node having a lower impedance than an impedance of the first voltage from the differential amplification part;

an input switch connected between the intermediate node and the input terminal, the input switch being turned off in the output mode and turned on in the transition mode; and a supply switch part for causing the output part to execute supply of the output current in the output mode and causing the output part to discontinue supply of the output current in the transition mode.

2. The display driver circuit according to claim 1, wherein:

the differential amplification part further has a second output node and outputs a second voltage from the second output node, the second voltage corresponding to a difference in voltages supplied to the first and second input nodes; and the display driver circuit further comprises:

a second capacitance element connected between a second supply node and the intermediate node, the second supply node being connected to the second output node of the differential amplification part; and a second supply switch connected between the second supply node and a fourth reference node, the second supply switch being turned off in the output mode and turned on in the transition mode, a voltage supplied to the fourth reference node having a lower impedance than an impedance of the second voltage from the differential amplification part.

3. The display driver circuit according to claim 2, wherein:

a positive voltage is supplied to the first reference node while a negative voltage is supplied to the second reference node;

the first driving transistor is a PMOS-type transistor having a source connected to the first reference node, a drain connected to the input-output node, and a gate receiving a voltage corresponding to a voltage of the first output node;

the second driving transistor is an NMOS-type transistor having a source connected to the second reference node, a drain connected to the input-output node, and a gate receiving a voltage corresponding to a voltage of the second output node;

the differential amplification part includes:

a first differential input circuit including a first input-side transistor and a second input-side transistor each having a source connected to the second reference node, a gate of the first input-side transistor receiving a voltage of the first input node, a gate of the second input-side transistor receiving a voltage of the second input node;

a first current mirror circuit including a first output-side transistor and a second output-side transistor respectively receiving outputs of the first and second input-side transistors, a source of each of the first and second output-side transistors being connected to the first reference node, gates of the first and second output-side transistors being connected to each other, a drain of the first output-side transistor being connected to the first output node, a gate and a drain of the second output-side transistor being connected to each other;

a second differential input circuit including a third input-side transistor and a fourth input-side transistor each having a source connected to the first reference node, a gate of the third input-side transistor receiving a voltage of the first input node, a gate of the fourth input-side transistor receiving a voltage of the second input node; and a second current mirror circuit including a third output-side transistor and a fourth output-side transistor respectively receiving outputs of the third and fourth input-side transistors, a source of each of the third and fourth output-side transistors being connected to the second reference node, gates of the third and fourth output-side transistors being connected to each other, a drain of the third output-side transistor being connected to the second output node, a gate and a drain of the fourth output-side transistor being connected to each other; and the supply switch part includes a connection switch provided between the first output node and the second output node, the connection switch connecting the first output node and the second output node to each other in the output mode and disconnecting the first output node and the second output node from each other in the transition mode.

4. The display driver circuit according to claim 3, wherein:

the differential amplification part further includes:

a first P-type transistor and a first N-type transistor connected in parallel between the first output node and the second output node; and a second P-type transistor and a second N-type transistor connected in parallel between the drains of the second and fourth output-side transistors; and the connection switch includes:

a third P-type transistor connected between the first output node and the first P-type transistor, the third P-type transistor being turned on in the output mode and turned off in the transition mode; and a third N-type transistor connected between the first N-type transistor and the second output node, the third N-type transistor being turned on in the output mode and turned off in the transition mode.

5. The display driver circuit according to claim 1, wherein the input switch is provided to charge or discharge the first capacitance element.

* * * * *